(12) United States Patent
Misawa et al.

(10) Patent No.: US 11,744,008 B2
(45) Date of Patent: Aug. 29, 2023

(54) PRINTED BOARD AND PRINTED BOARD ASSEMBLY

(71) Applicant: Sumitomo Electric Industries, Ltd., Osaka (JP)

(72) Inventors: Taichi Misawa, Osaka (JP); Keiji Tanaka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 5 days.

(21) Appl. No.: 17/694,213

(22) Filed: Mar. 14, 2022

(65) Prior Publication Data

US 2022/0295630 A1 Sep. 15, 2022

(30) Foreign Application Priority Data

Mar. 15, 2021 (JP) ................................ 2021-041162

(51) Int. Cl.
*H05K 1/02* (2006.01)
*H05K 1/11* (2006.01)

(52) U.S. Cl.
CPC .......... *H05K 1/0245* (2013.01); *H05K 1/024* (2013.01); *H05K 1/115* (2013.01)

(58) Field of Classification Search
CPC .... H05K 1/0237; H05K 1/0239; H05K 1/024; H05K 1/0242; H05K 1/0243; H05K 1/0245; H05K 1/0246; H05K 1/0248; H05K 1/025; H05K 1/0251; H05K 1/0253; H05K 1/115; H05K 1/116; H05K 1/117; H05K 1/118; H05K 1/189; H05K 2201/09427; H05K 2201/0949; H05K 2201/10121; H01P 3/00–20
See application file for complete search history.

(56) References Cited

U.S. PATENT DOCUMENTS

2007/0102830 A1* 5/2007 Muto ..................... H05K 1/118
257/784

FOREIGN PATENT DOCUMENTS

JP 2010-212617 A 9/2010
WO WO-9509452 A1 * 4/1995 ................ H01P 5/02

OTHER PUBLICATIONS

Persson (WO 9509452) provided with Office Action (Year: 1995).*

* cited by examiner

*Primary Examiner* — Roshn K Varghese
(74) *Attorney, Agent, or Firm* — Volpe Koenig

(57) ABSTRACT

A printed board includes a first wiring layer including a first terminal, a second wiring layer including a second terminal facing to the first terminal, a dielectric layer interposed between the first wiring layer and the second wiring layer and having an end face, and a plurality of through-hole vias configured to electrically connect the first terminal and the second terminal. The plurality of through-hole vias includes a first through-hole via which is closest to an end-face edge of the first terminal, and a second through-hole via which is closest to an inner edge of the second terminal. The end-face edge being closer to the end face than the inner edge. A distance between the first through-hole via and the end-face edge is equal to or smaller than one eighth of a signal wavelength of a high speed signal transmitted through the first terminal.

13 Claims, 22 Drawing Sheets

PRINTED BOARD AND PRINTED BOARD ASSEMBLY

CROSS-REFERENCE TO RELATED APPLICATIONS

This application claims priority from Japanese Patent Application No. 2021-041162, filed on Mar. 15, 2021, the entire subject matter of which is incorporated herein by reference.

TECHNICAL FIELD

The present disclosure relates to a printed board and a printed board assembly.

BACKGROUND

Japanese Unexamined Patent Application Publication No. 2010-212617 discloses a technique related to a flexible wiring board. The flexible wiring board includes a first wiring layer, a second wiring layer, and a terminal for electrical connection with an external conductive element. The first wiring layer includes at least one signal line. The second wiring layer includes a ground conductor pattern. The terminal is electrically connected to a signal line. The signal line includes a transmission line portion and a wiring portion. The transmission line portion is disposed along the ground conductor pattern. The wiring portion connects the transmission line portion and the terminal to each other.

SUMMARY

A printed board of the present disclosure has a junction section at an end portion in a first direction. The printed board includes a first wiring layer including a first terminal and a first signal line, the first terminal being placed in the junction section, the first signal line being connected to the first terminal, a second wiring layer including a second terminal placed away from the first terminal in a thickness direction intersecting the first direction, the second terminal facing to the first terminal, a first dielectric layer interposed between the first wiring layer and the second wiring layer, the first dielectric layer having an end face in the end portion, the end face extending in a second direction intersecting both the first direction and the thickness direction, and a plurality of through-hole vias configured to electrically connect the first terminal and the second terminal to each other, the plurality of through-hole vias being placed along the first direction inside the first terminal and the second terminal in a planer view from above in the thickness direction. The plurality of through-hole vias includes a first through-hole via and a second through-hole via, the first through-hole via being closest to an end-face edge of the first terminal in the first direction, the second through-hole via being closest to an inner edge of the second terminal in the first direction, the end-face edge being closer to the end face than the inner edge in the first direction. The first through-hole via has a first distance between the first through-hole via and the end-face edge of the first terminal, the first distance being set to be equal to or smaller than one eighth of a signal wavelength of a high speed signal transmitted through the first terminal. The second through-hole via has a second distance between the second through-hole via and the inner edge of the second terminal, the second distance being set to be equal to or smaller than one eighth of a signal wavelength of the high speed signal transmitted through the second terminal.

BRIEF DESCRIPTION OF THE DRAWINGS

FIG. 8 is omitted.

DETAILED DESCRIPTION

Details of Embodiments of Present Disclosure

Figure 1:
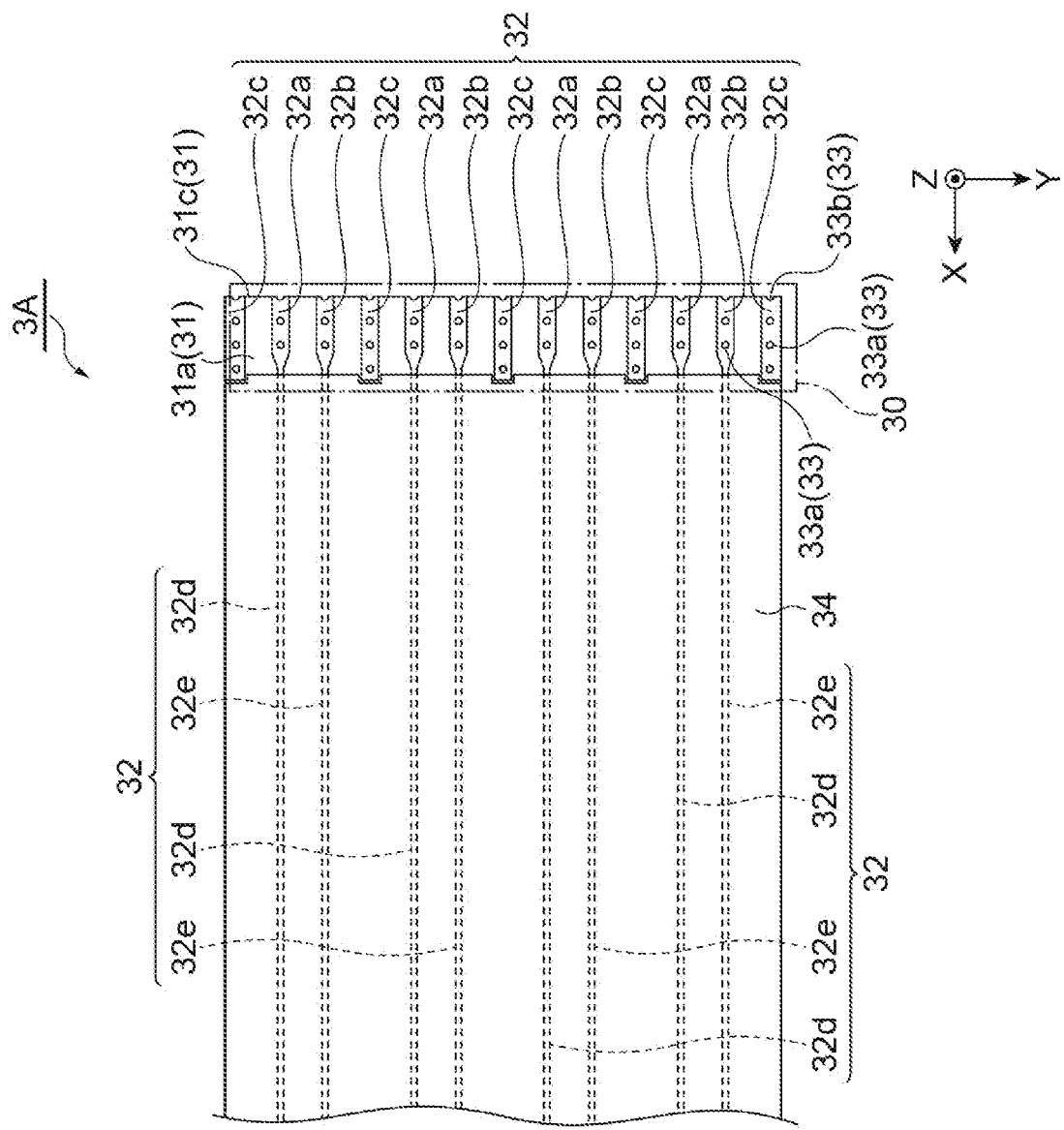
FIG. 1 is a top plan view of a printed board according to an embodiment of the present disclosure.

Specific examples of a printed board and a printed board assembly of the present disclosure will be described below with reference to the drawings. Note that the present invention is not limited to these examples, but is indicated by the scope of the claims, and is intended to include all modifications within the meaning and range equivalent to the scope of the claims. In the following description, the same elements are denoted by the same reference numerals in the description of the drawings, and redundant description will be omitted. In each drawing, an XYZ orthogonal coordinate system is shown as necessary for description.

Figure 2:
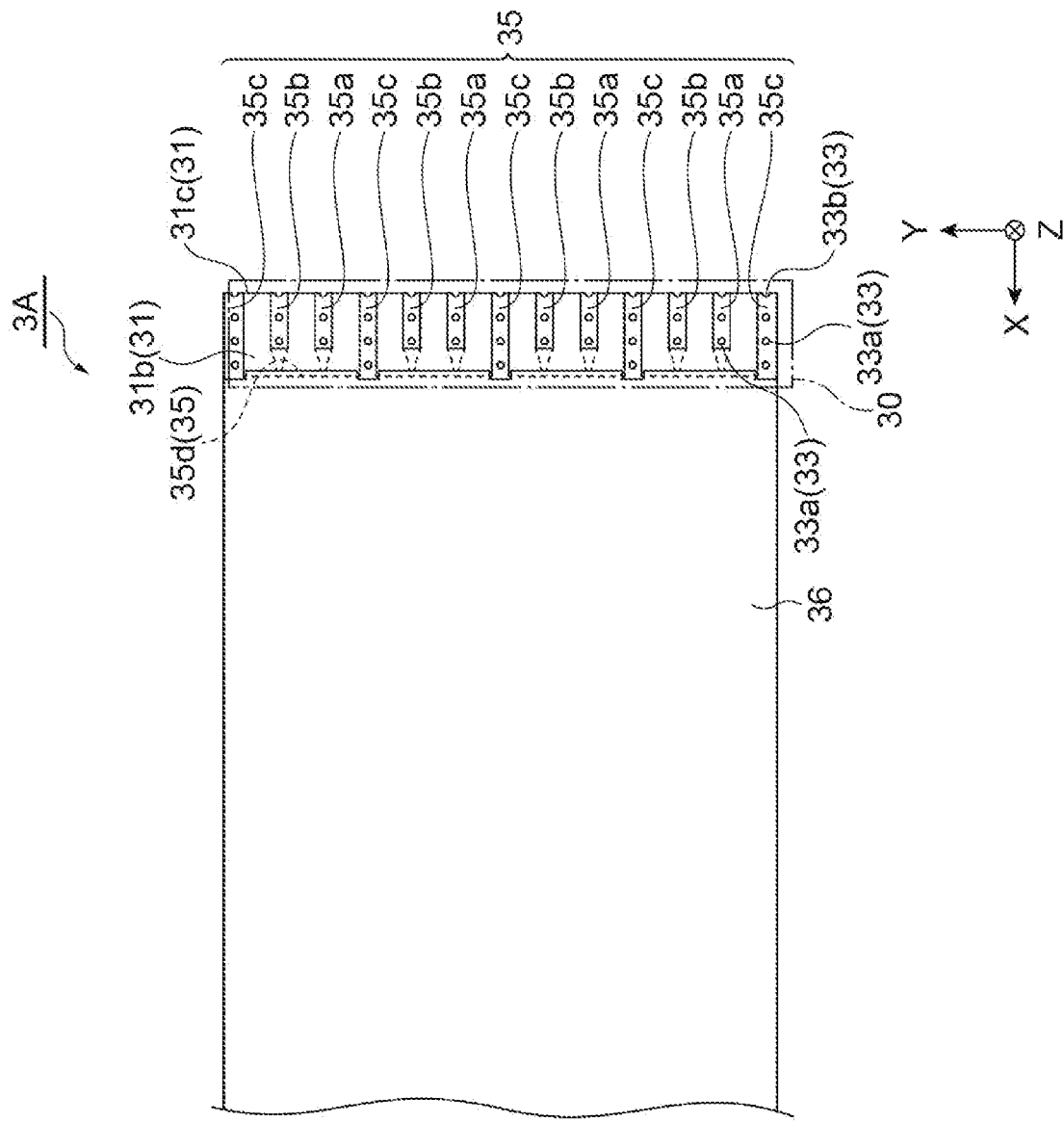
FIG. 2 is a bottom view of the printed board from a back side.
Figure 3:
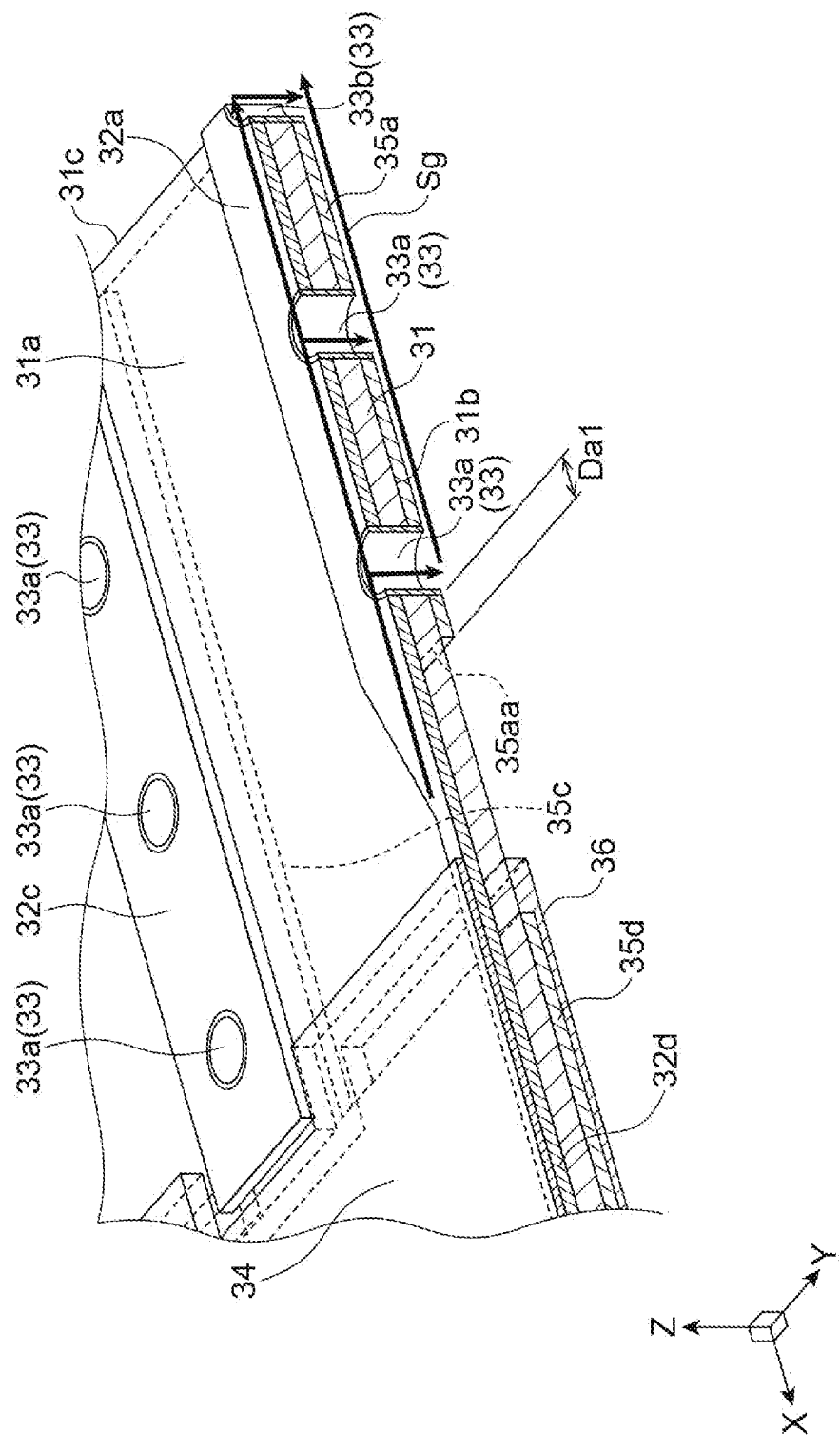
FIG. 3 is a cut-away perspective view showing an enlarged portion of a printed board.

FIG. 1 is a top plan view of a printed board 3A according to one embodiment of the present disclosure. The printed board 3A is, for example, a flexible printed circuit (FPC). FIG. 2 is a bottom view of the printed board 3A as seen from a back side. FIG. 3 is a cut-away perspective view showing an enlarged portion of the printed board 3A. The printed board 3A of the present disclosure is a thin plate-shaped member having a longitudinal direction in an X direction (first direction) and a lateral direction in a Y direction orthogonal to the X direction. A dimension (length) of the printed board 3A along the longitudinal direction is greater than a dimension (length) of the printed board 3A along the lateral direction. In one example, a shape (planar shape) of the printed board 3A in planar view from a Z direction is a rectangle. The Z direction is a direction orthogonal to the X direction and the Y direction. The printed board 3A has a junction section 30 at an end in the X direction. The junction section 30 is a portion for electrically connecting the printed board 3A and an assembly part which will be described later. The junction section 30 is provided at an end portion of the printed board 3A from an edge to the other edge of the printed board 3A in the Y direction. Although FIG. 1 and FIG. 2 show the junction section 30 provided at one end of the printed board 3A, a junction section having a similar structure may also be provided at the other end of the printed board 3A. The other end of the printed board 3A is an end opposite to the one end of the printed board 3A in the longitudinal direction.

The printed board 3A includes a dielectric layer 31, a first wiring layer 32 and a protective film 34 (both refer to FIG. 1), a second wiring layer 35 and a protective film 36 (both refer to FIG. 2), and a plurality of through-hole vias 33 which may be referred to as through-holes or via holes. The dielectric layer 31 is also referred to as a base or a core. For example, when the printed board 3A is the flexible printed circuit, the dielectric layer 31 is a base film.

The dielectric layer 31 is interposed between the first wiring layer 32 and the second wiring layer 35. The dielectric layer 31 extends along an XY plane, and is made of an insulating dielectric material. For example, in the case of the flexible printed circuit, the dielectric layer 31 is a flexible plastic film made of a plastic material such as polyimide, liquid crystal polymer (LCP), or fluororesin. A height of the dielectric layer 31 in the Z direction is not particularly limited, but is, for example, 0.05 mm. The dielectric layer 31 has a first surface 31a and a second surface 31b opposite to the first surface 31a. The first surface 31a and the second surface 31b are flat planes along the XY plane. When the dielectric layer 31 has flexibility, the first surface 31a and the second surface 31b can be curved in the Z direction. The first surface 31a is parallel to the second surface 31b. A planar shape of the dielectric layer 31 in planar view from the Z direction is a rectangle whose longitudinal direction is the X direction. The dielectric layer 31 has an end face 31c in the X direction. The end face 31c corresponds to an edge of the dielectric layer 31 in the X direction. The end face 31c is included in an end portion (junction section 30) of the printed board 3A. The end face 31c extends along the Y direction.

The first wiring layer 32 is a wiring layer including a conductive film provided on the first surface 31a of the dielectric layer 31. The conductive film has electrical conductivity. The wiring layer can be provided with a plurality of wirings formed of a conductive film. For example, the first wiring layer 32 includes signal terminals 32a and 32b, a ground terminal 32c, signal lines 32d and 32e. The signal terminals 32a, 32b, the ground terminal 32c, and the signal lines 32d, 32e are formed of the conductive films. These conductive films are metal films such as copper foil, copper plating, and gold plating. Each of the signal terminals 32a and 32b is an example of a first terminal in the present disclosure. Each planar shape of the signal terminals 32a and 32b in planar view from the Z direction is a rectangle whose longitudinal direction is the X direction. Each of the signal lines 32d and 32e is an example of a first signal line in the present disclosure.

The signal terminals 32a, 32b, and the ground terminal 32c are arranged side by side in the Y direction in the junction section 30. In particular, a plurality of ground terminals 32c are arranged in the Y direction. A pair of signal terminals 32a and 32b disposed adjacent to each other in the Y direction are disposed between the ground terminals 32c. In other words, the ground terminal 32c and the pair of signal terminals 32a and 32b are alternately arranged along the Y direction. For example, the ground terminals 32c are disposed at both ends of the junction section 30 in the Y direction. For example, when the first wiring layer 32 includes only one pair of signal terminals 32a and 32b, the pair of signal terminals 32a and 32b is disposed between two ground terminals 32c. Further, the signal lines 32d and 32e extend along the X direction from one end to the other end of the printed board 3A. One end of the signal line 32d is connected to the signal terminal 32a, and one end of the signal line 32e is connected to the signal terminal 32b. The signal line 32d and the signal terminal 32a are integrally formed of one conductive film. The signal line 32e and the signal terminal 32b are integrally formed of one conductive film. Lengths of the signal lines 32d and 32e in the X direction are greater than lengths of the signal terminals 32a and 32b in the same direction. Widths of the signal lines 32d, 32e in the Y direction is smaller than widths of the signal terminals 32a, 32b in the same direction. The signal lines 32d and 32e may have the same shape. The signal terminals 32a and 32b may have the same shape.

High-speed differential signals are supplied to the signal lines 32d and 32e. The signals supplied to the signal lines 32d and 32e contain, for example, frequency components of frequencies above 30 GHz or above 50 GHz. The signal lines 32d and 32e transmit signals along the X direction. The differential signal includes a pair of complementary signals. When one of the complementary signals is a positive-phase signal and the other is a negative-phase signal, the positive-phase signal has a phase opposite to that of the negative-phase signal. For example, when the positive phase signal increases, the negative phase signal decreases, and when the positive phase signal decreases, the negative phase signal increases. When the positive phase signal reaches the maximum value (peak value), the negative phase signal reaches the minimum value (bottom value), and when the positive phase signal reaches the bottom value, the negative phase signal reaches the peak value. The positive-phase signal has an amplitude equal to the amplitude of the negative-phase signal and has the same average value as the average value of the negative-phase signal. It should be noted that the term "equal" as used herein includes being different from each other within an allowable range. The allowable range is, for example, within 5% of the absolute value of the respective value. For example, the signal line 32d carries the positive phase signal and the signal line 32e carries the negative phase signal. Note that the signal line 32d may transmit the negative-phase signal and the signal line 32e may transmit the positive-phase signal. The signal lines 32d and 32e constitute a transmission line together with a ground line 35d to be described later. The signal lines 32d and 32e are covered with the protective film 34. The protective film 34 is an insulating film provided over an entire surface of the first surface 31a except for the junction section 30. The protective film 34 has insulating properties. The protective film 34 is made of, for example, a resin material. The protective film 34 is also referred to as a resist or a cover layer.

The second wiring layer 35 is a wiring layer including a conductive film provided on the second surface 31b of the dielectric layer 31. The conductive film has electrical conductivity. The wiring layer can be provided with a plurality of wirings formed of the conductive film. For example, the second wiring layer 35 includes signal terminals 35a and 35b, a ground terminal 35c, and the ground line 35d. The signal terminals 35a, 35b, the ground terminal 35c, and the ground line 35d are formed of the conductive films. These conductive films are metal films such as copper foil, copper plating, and gold plating. The signal terminals 35a and 35b are terminals for conductive junction with an assembly part described later, and are examples of a second terminal in the present disclosure. Each planar shape of the the signal terminals 35a and 35b in planar view from the Z direction is a rectangle whose longitudinal direction is the X direction.

The signal terminals 35a, 35b, and the ground terminal 35c are arranged side by side in the Y direction in the junction section 30. Specific aspects of the signal terminals 35a, 35b, and the ground terminal 35c are similar to the signal terminals 32a, 32b, and the ground terminal 32c of the first wiring layer 32. The signal terminals 35a and 35b are respectively opposed to the signal terminals 32a and 32b across the dielectric layer 31 in a thickness direction (Z direction) of the printed board 3A. The ground terminal 35c is disposed at a position facing the ground terminal 32c with the dielectric layer 31 interposed therebetween. The ground line 35d extends along the X direction from one end to the other end of the printed board 3A, except for the junction section 30. One end of the ground line 35d is connected to the ground terminal 35c. A width of the ground line 35d in the Y direction is substantially equal to a width of the dielectric layer 31 in the same direction. For example, the ground line 35d is also referred to as a solid ground (planar ground pattern).

The ground line 35d is covered by the protective film 36. The protective film 36 is an insulating film provided over an entire surface of the second surface 31b except for the junction section 30. The protective film 36 has insulating properties. As the constituent material of the protective film 36, for example, those exemplified as the constituent material of the protective film 34 are used.

The through-hole vias 33 are wirings extending from the first surface 31a to the second surface 31b of the dielectric layer 31. Some through-hole vias 33 are provided between the signal terminal 32a and the signal terminal 35a, and electrically connect the signal terminal 32a and the signal terminal 35a. In the planar view from the Z direction, at least two through-hole vias 33 are provided side by side in the X direction inside one signal terminal 32a and the signal terminal 35a facing to the signal terminal 32a. Some other through-hole vias 33 are provided between the signal ter-
minal 32b and the signal terminal 35b, and electrically connect the signal terminal 32b and the signal terminal 35b. In the planar view from the Z direction, at least two through-hole vias 33 are provided side by side in the X direction inside one signal terminal 32b and the signal terminal 35b opposed to the signal terminal 32b. The remaining through-hole vias 33 are provided between the ground terminal 32c and the ground terminal 35c, and electrically connects the ground terminal 32c and the ground terminal 35c. In the planar view from the Z direction, at least one through-hole via 33 is provided inside the ground terminal 32c and the ground terminal 35c opposite to the ground terminal 32c.

The plurality of through-hole vias 33 includes, for example, a plurality of through-hole vias 33a and a plurality of half vias 33b. The through-hole via 33a is disposed away from the end face 31c of the dielectric layer 31 in the X direction. The through-hole via 33a is, for example, a metallic film formed in a hole penetrating the dielectric layer 31 from the first surface 31a to the second surface 31b. The hole has, for example, a cylindrical shape. The half via 33b is provided in the end face 31c of the dielectric layer 31. The half via 33b is a metallic film formed in a groove formed in the end face 31c. A shape of the groove is, for example, a shape obtained by cutting a cylindrical hole in half along a plane parallel to a YZ plane. The half via 33b is a through-hole via closest to the end face 31c among the plurality of through-hole vias 33 provided between each signal terminal 32a (32b) and each signal terminal 35a (35b), and is an example of a first through-hole via in the present disclosure.

As shown in FIGS. 1 and 2, in the planar view from the Z direction, two through-hole vias 33a and one half via 33b are arranged side by side in the X direction inside the signal terminal 32a and the signal terminal 35a. Similarly, in the planar view from the Z direction, two through-hole vias 33a and one half via 33b are arranged side by side in the X direction inside the signal terminal 32b and the signal terminal 35b. In the planar view from the Z direction, three through-hole vias 33a and one half via 33b are arranged side by side in the X direction inside the ground terminal 32c and the ground terminal 35c. As such, the number of through-hole vias 33 electrically connecting one ground terminal 32c and the ground terminal 35c opposite to the ground terminal 32c may be greater than the number of through-hole vias 33 electrically connecting one signal terminal 32a and the signal terminal 35a opposite to the signal terminal 32a or the number of through-hole vias 33 electrically connecting one signal terminal 32b and the signal terminal 35b opposite to the signal terminal 32b.

As shown in FIG. 3, the signal terminal 35a has an inner edge 35aa opposite to the end face 31c among both edges of the signal terminal 35a in the X direction. The plurality of through-hole vias 33 electrically connecting one signal terminal 32a and the signal terminal 35a opposite to the signal terminal 32a include a through-hole via 33a closest to the inner edge 35aa of the signal terminal 35a (second through-hole via). The through-hole via 33a closest to the inner edge 35aa and the inner edge 35aa are separated by a distance Da1 (second distance). The inner edge 35aa is an edge farthest from the end face 31c in the X direction in the signal terminal 35a. The inner edge 35aa is the end closer to the ground line 35d than the end face 31c in the X direction in the signal terminal 35a. In one example, the inner edge 35aa is the edge in the X direction of an annular land pattern around a hole required for forming the through-hole via 33a. The land pattern is included in the signal terminal 35a. In addition, the distance between the through-hole via 33a and the inner edge 35aa refers to a distance (shortest distance) between the inner edge 35aa and a portion of the through-hole via 33a closest to the inner edge 35aa. A length of the distance Da1 is smaller than or equal to one eighth, more preferably smaller than or equal to one sixteenth, of the wavelengths of the high speed signals propagating through the signal terminal 35a. The signal terminal 35b has a configuration similar to that of the signal terminal 35a described above.

Figure 4:
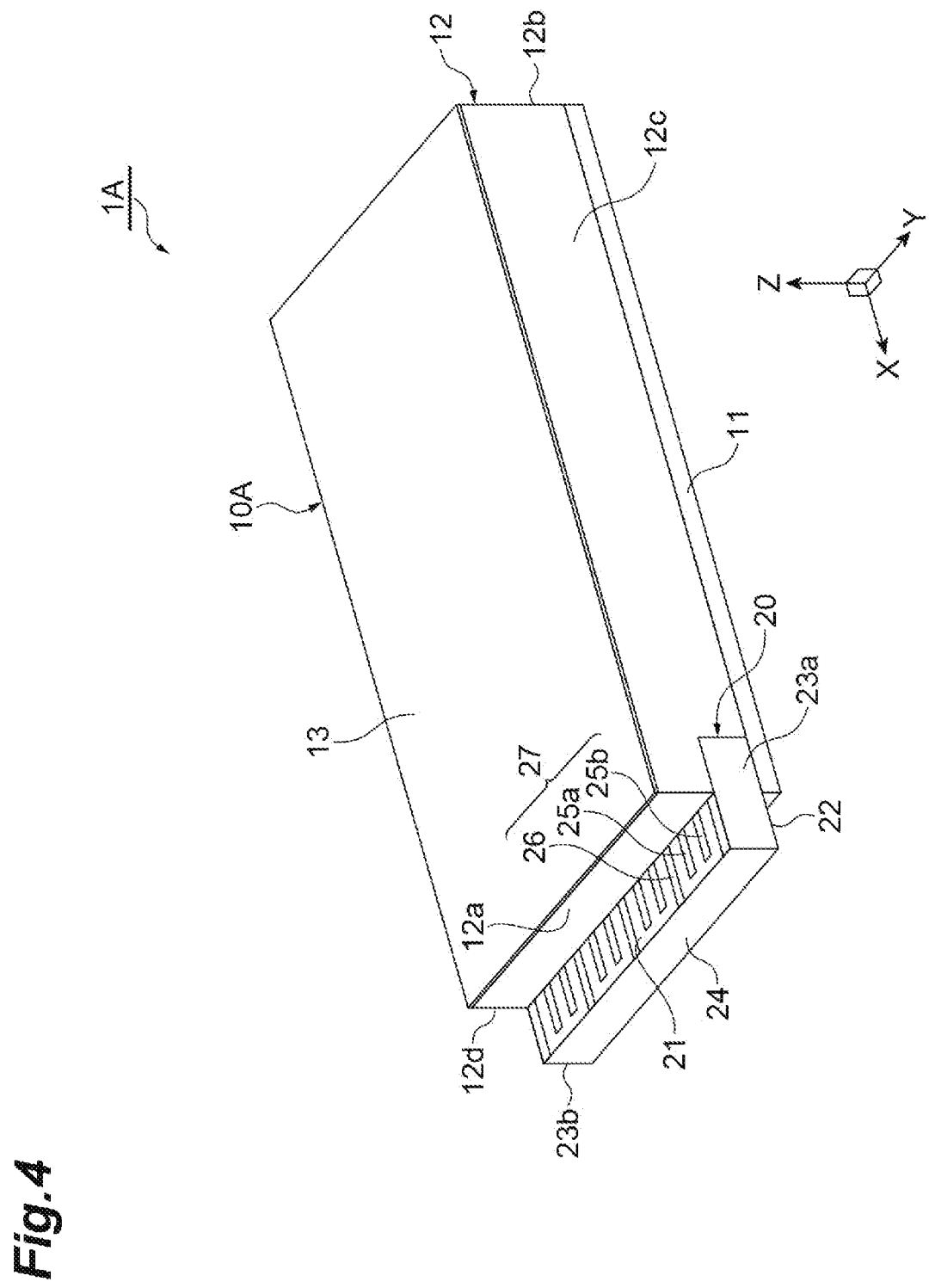
FIG. 4 is a perspective view of an optical module to which a printed board is assembled.
Figure 5:
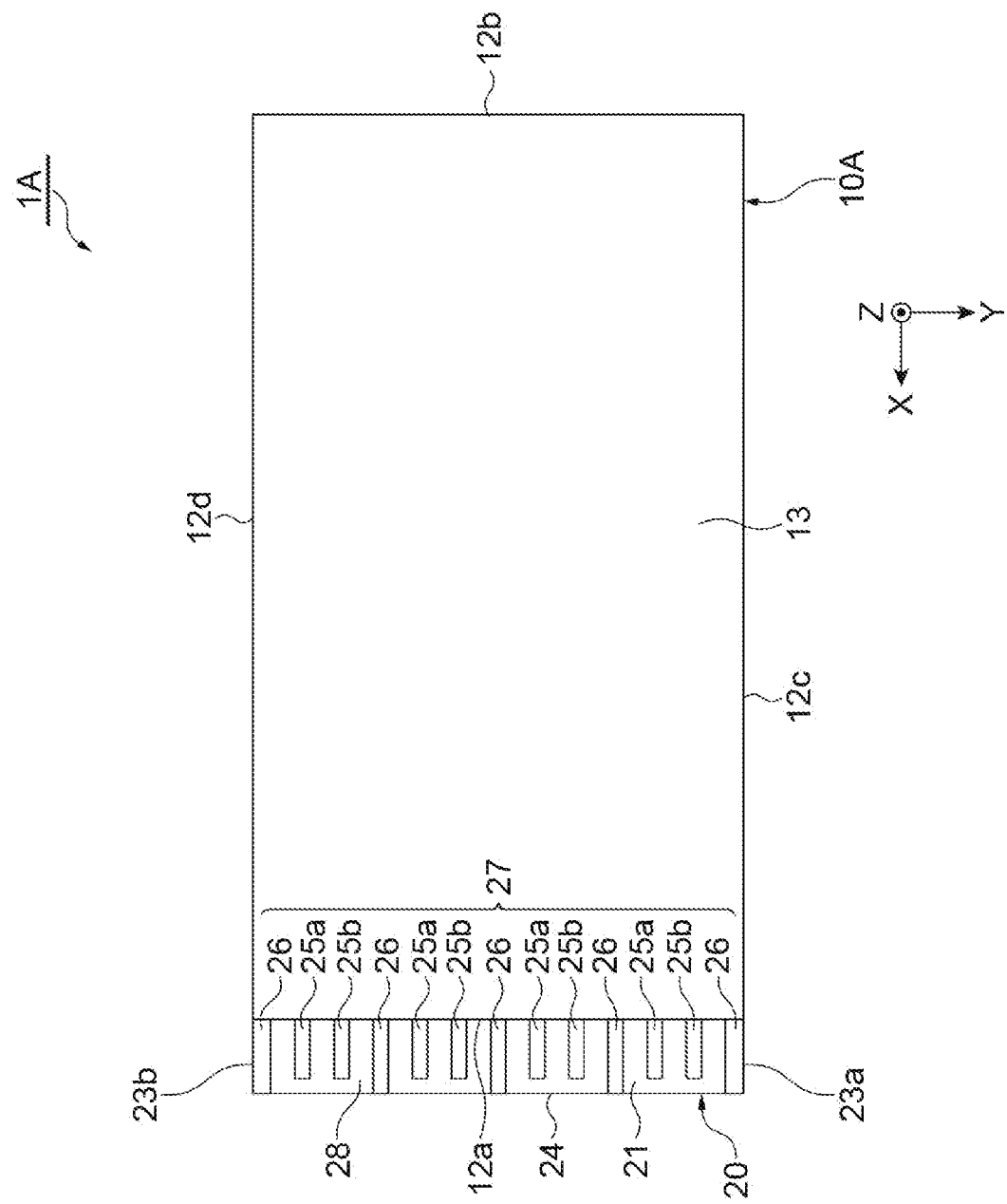
FIG. 5 is a plan view of an optical module.

FIG. 4 is a perspective view showing an optical module 1A to which the printed board 3A to be assembled. FIG. 5 is a plan view of the optical module 1A. The optical module 1A includes at least one of a light reception element and a light emitting element for optical communication. The light reception element is, for example, a photodiode, and converts a high-speed optical signal input from outside into an electric signal (reception signal) and outputs the electric signal. The light emitting element is, for example, a laser diode, and converts a high-speed electric signal (transmission signal) input from outside into an optical signal and outputs the optical signal. For example, when the optical module 1A includes the light reception element, the optical module 1A is used as an optical reception module that receives optical signals. When the optical module 1A includes the light emitting element, the optical module 1A is used as an optical transmission module that transmits optical signals. When the optical module 1A includes both the light reception element and the light emitting element, the optical module 1A is used as an optical transceiver module for transmitting and receiving optical signals.

The optical module 1A has a package 10A as an assembly part assembled with the printed board 3A. The package 10A houses at least one of a light reception element or a light emitting element provided in the optical module 1A and an electronic circuit connected to the light reception element or the light emitting element. The package 10A has, for example, a rectangular parallelepiped outer shape. The package 10A includes, for example, a bottom plate 11, a side wall 12 having a rectangular frame shape provided on the bottom plate 11, and a top plate 13 provided on the side wall 12. The bottom plate 11, the side wall 12, and the top plate 13 define an internal space of the package 10A. The side wall 12 has a front surface 12a and a back surface 12b opposed to each other in the X direction, and has side surfaces 12c and 12d opposed to each other in the Y direction. The front surface 12a and the back surface 12b each extend along a plane intersecting the X direction. The side surfaces 12c and 12d each extends along a plane intersecting the Y direction. The side surface 12c connects the front surface 12a and the back surface 12b on one side in the Y direction. The side surface 12d connects the front surface 12a and the back surface 12b on the other side in the Y direction.

The package 10A further includes a feed-through 20. The feed-through 20 is, for example, a plate-shaped member provided at a front end portion of the package 10A in the X direction. The feed-through 20 is disposed so as to close an opening provided in the front surface 12a of the side wall 12. The feed-through 20 passes through the side wall 12 from outside the package 10A to the internal space of the package 10A. The feed-through 20 includes a plate-shaped dielectric member 22 and a wiring layer 27. The dielectric member 22 has an insulating property and is mainly made of a ceramic material, for example. The dielectric member 22 is, for example, aluminum oxide (alumina). A three dimensional shape of the dielectric member 22 is a rectangular parallelepiped whose longitudinal direction is the Y direction. The dielectric member 22 has a main surface 21 facing upward in the Z direction, side surfaces 23a and 23b located at one end and the other end in the Y direction, respectively, and an end surface 24 facing forward in the X direction. The end surface 24 is a leading surface of the feed-through 20 (and also of the optical module 1A) in the X direction.

The wiring layer 27 is a wiring layer including a conductive film provided on the main surface 21 of the dielectric member 22. The wiring layer 27 is an example of a third wiring layer in the present disclosure. The conductive film has electrical conductivity. The wiring layer 27 can be provided with a plurality of wirings formed of the conductive film. The conductive film is a metal film such as an Au film. The wiring layer 27 includes, for example, signal terminals 25a and 25b, and a ground terminal 26. Each of the signal terminals 25a and 25b is an example of a third terminal in the present disclosure. Each planar shape of the signal terminals 25a, 25b, and the ground terminal 26 in the planar view from the Z direction is a rectangle whose longitudinal direction is the X direction. Each length of the signal terminals 25a, 25b, and the ground terminal 26 in the X direction is longer than each length of the signal terminals 25a, 25b, and the ground terminal 26 in the Y direction.

The signal terminals 25a, 25b and the ground terminal 26 are arranged side by side in the Y direction on the main surface 21. Specifically, a plurality of ground terminals 26 are arranged side by side in the Y direction. A pair of signal terminals 25a and 25b disposed adjacent to each other in the Y direction are disposed between the ground terminals 26. In other words, the ground terminal 26 and the pair of signal terminals 25a and 25b are alternately arranged along the Y direction. The signal terminals 25a and 25b are electrically connected to a circuit inside the package 10A via wirings provided in the feed-through 20. The ground terminal 26 is electrically connected to a ground potential pattern inside the package 10A via a wiring provided in the feed-through 20. The signal terminals 25a, 25b, and ground terminals 26 are arranged side by side in the Y direction at a constant interval (arrangement pitch). Here, the arrangement pitch corresponds to a distance between center lines adjacent to each other with respect to the center line extending along the X direction of each terminal. The signal terminals 32a, 32b, and the ground terminal 32c of the printed board 3A are arranged side by side in the Y direction at a constant interval (arrangement pitch). Each of the arrangement pitches of the signal terminals 25a, 25b and the ground terminals 26 is equal to each of the arrangement pitches of the signal terminals 32a, 32b and the ground terminals 32c of the printed board 3A. The front surface 12a, the side surfaces 23a and 23b, and the end surface 24 define a junction section 28 on the main surface 21. The junction section 28 includes the signal terminals 25a, 25b, and the ground terminals 26 in planar view from the Z direction. For example, the junction section 28 has a rectangular shape on the main surface 21.

Figure 6:
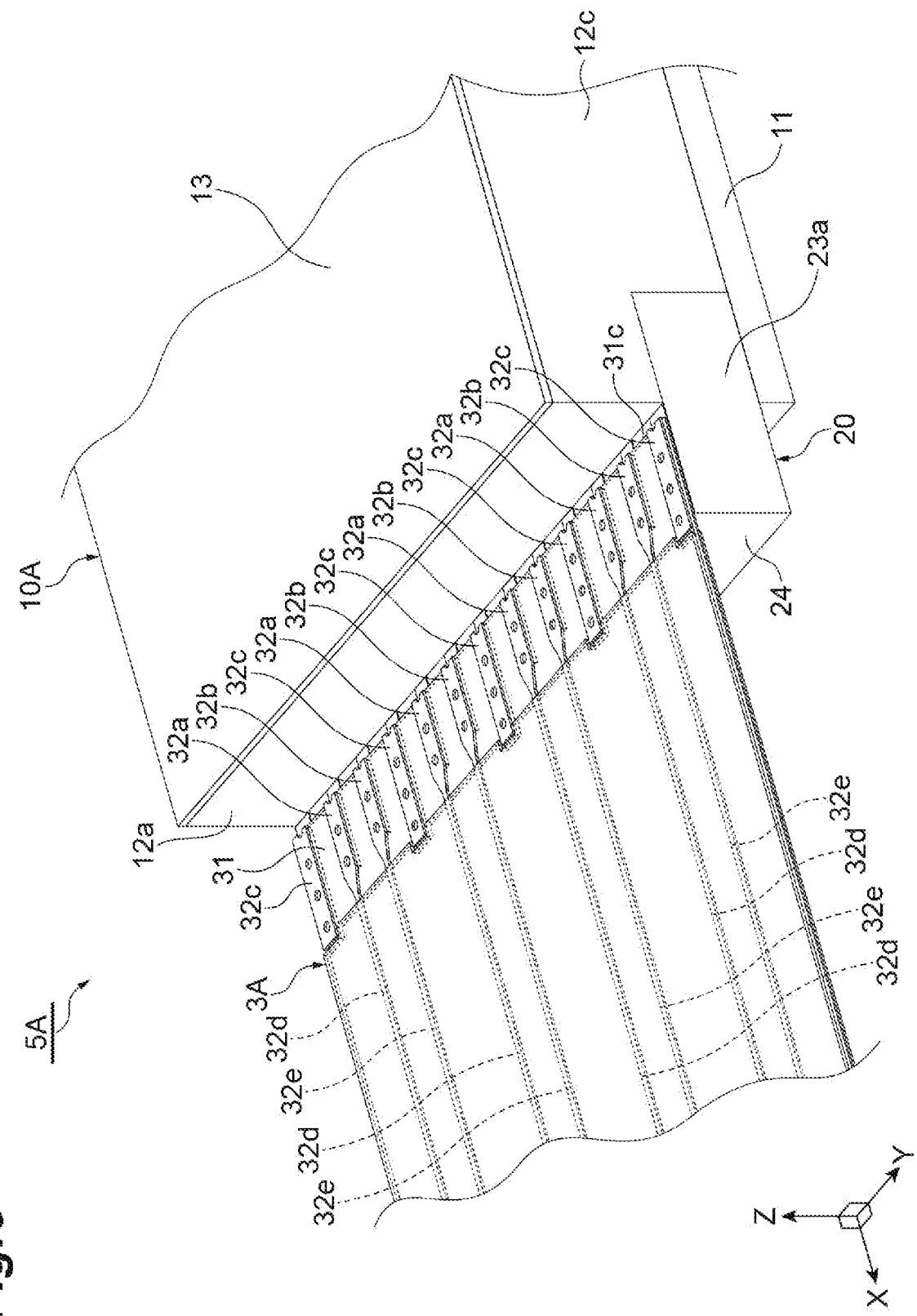
FIG. 6 is a perspective view showing a state in which a printed board and a package are assembled.
Figure 7:
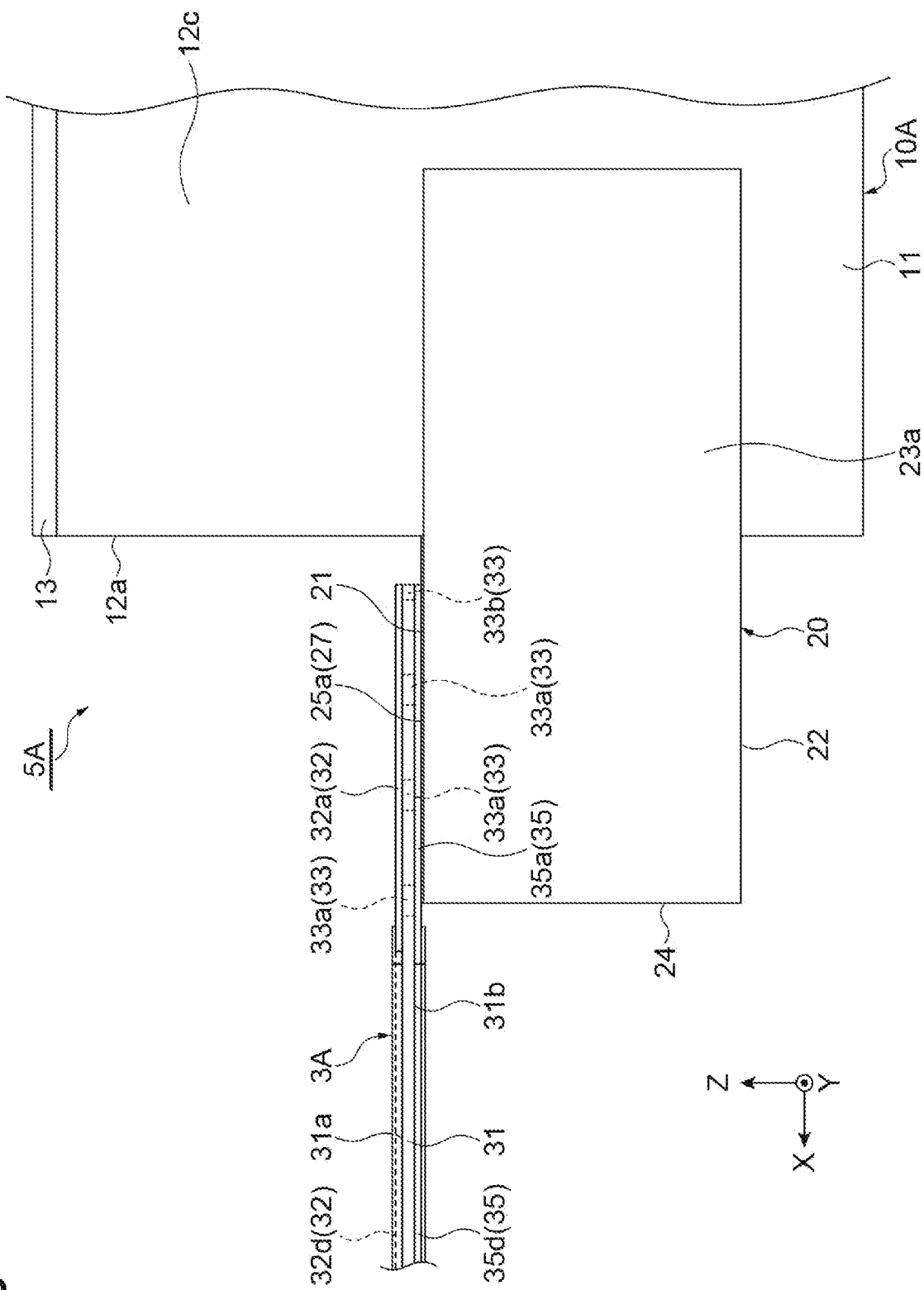
FIG. 7 is a side view showing the assembled state.
Figure 8:
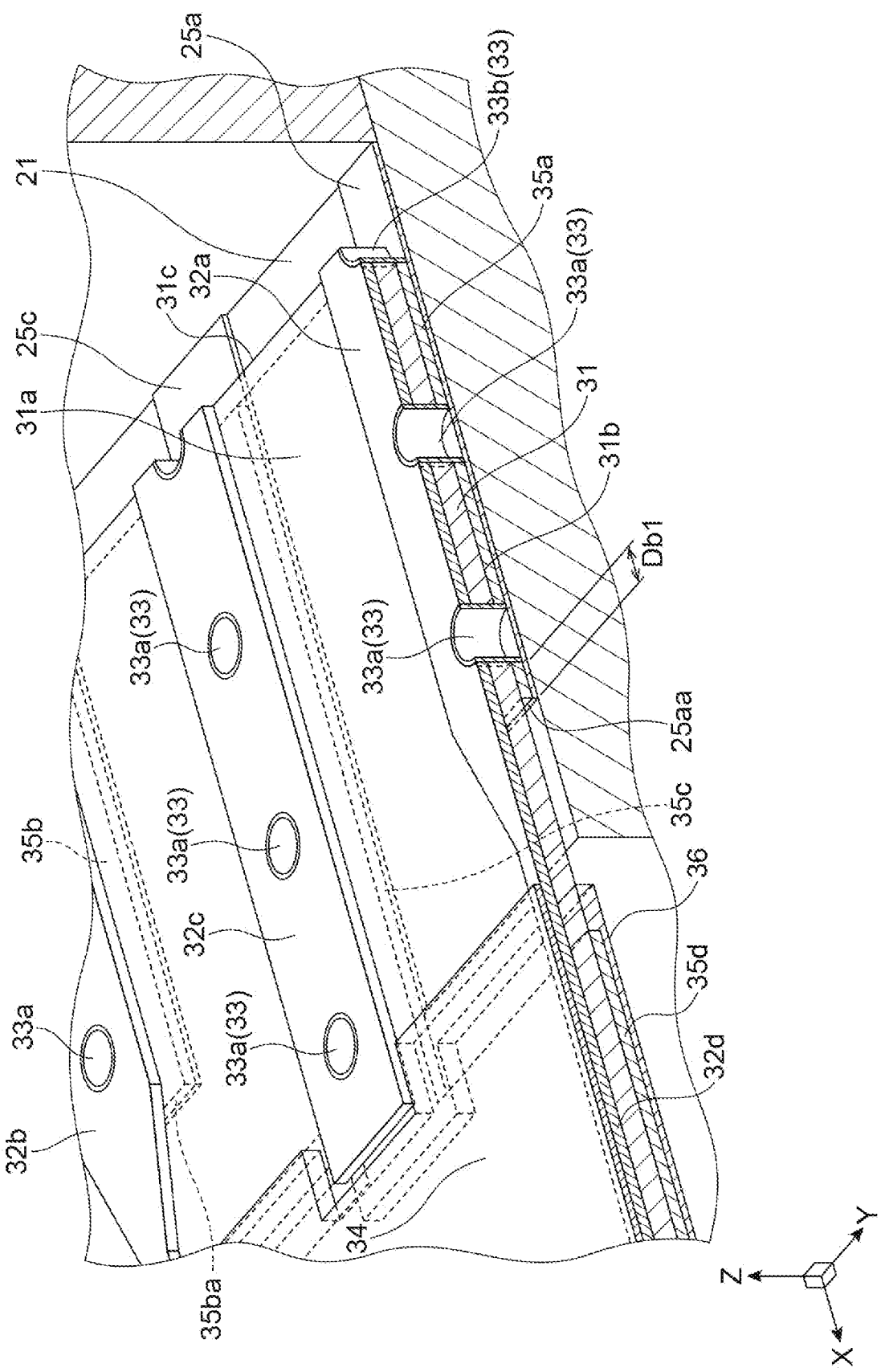
FIG. 8 is an enlarged perspective view of a portion of FIG. 6.

FIG. 6 is a perspective view showing a state in which the printed board 3A is assembled to the package 10A, and FIG. 7 is a side view showing the same state. FIG. 8 is an enlarged perspective view of a portion of FIG. 6. As shown in FIGS. 6 to 8, the printed board 3A and the package 10A are assembled together to form a printed board assembly 5A.

In the printed board assembly 5A, each of the signal terminals 35a, 35b, and the ground terminal 35c of the printed board 3A is conductively joined to each of the signal terminals 25a, 25b, and the ground terminal 26 of the feed-through 20, respectively, by solder or the like. The junction section 30 overlaps with the junction section 28 in planar view from the Z direction. As shown in FIG. 8, in a state in which one signal terminal 25a is conductively joined to one signal terminal 35a, an end-surface edge 25aa of the signal terminal 25a in the X direction and the through-hole via 33a closest to the end-surface edge 25aa (third through-hole via) are separated from each other by a distance Db1 (third distance). The end-surface edge 25aa is an edge opposite to the end face 31c (i.e., the end-surface edge 25aa is an edge near the end surface 24). The end-surface edge 25aa is provided between the second through-hole via and the end surface 24 in the X direction. The through-hole via 33a closest to the end-surface edge 25aa (third through-hole via) is a through-hole via closest to the end-surface edge 25aa among the plurality of through-hole vias 33 included inside the signal terminal 35a and the signal terminal 32a facing to the signal terminal 35a in the planar view from the Z direction. The end-surface edge 25aa is a leading edge in the signal terminal 25a. In one example, a position of the end-surface edge 25aa in the X direction coincides with a position of the inner edge 35aa of the signal terminal 35a in the same direction (see FIG. 3). Further, the distance between the through-hole via 33a (third through-hole via) and the end-surface edge 25aa refers to the distance (shortest distance) between a portion of the through-hole via 33a included in one signal terminal 35a that is closest to the end-surface edge 25aa and the end-surface edge 25aa of the signal terminal 25a that is joined to the signal terminal 35a. The signal terminal 25b has a configuration similar to that of the signal terminal 25a described above. The signal terminal 25b is conductively joined to the signal terminal 35b. The relationship between the signal terminal 25a and the signal terminal 35a described above is also applied to the relationship between the signal terminal 25b and the signal terminal 35b.

The distance Da1 is smaller than or equal to one eighth, more preferably less than or equal to one sixteenth, of the wavelengths of the high speed signals propagating through the signal terminal 32a. The distance Db1 is less than or equal to one eighth of the wavelengths of the high speed signals propagating through the signal terminals 35a and 25a, and more preferably less than or equal to one sixteenth.

Effects obtained by the printed board 3A and the printed board assembly 5A of the embodiment of the present disclosure described above will be described. When transmitting high speed signals, for example, signals having frequency components equal to or higher than 30 GHz, if an open stub having a length equal to or shorter than one fourth of the wavelengths of the signals is present in the middle of a transmission path for transmitting the high speed signals, the open stub acts as a capacitance (has capacitive properties). In particular, when the length of the open stub is close to one fourth of the signal wavelength, reflection of a frequency component related to the signal wavelength in the open stub increases, and thus a signal waveform of the high speed signal deteriorates. In particular, when a relative dielectric constant of the dielectric member 22 (e.g., alumina) of the feed-through 20 is larger than a relative dielectric constant of the dielectric layer 31 (e.g., polyimide) of the printed board 3A, in case the printed board 3A and the feed-through 20 are joined as shown in FIG. 6, an effective relative dielectric constant of the capacitive open stub is larger than that of the printed board 3A when the printed board 3A is not joined. As a result, the signal wavelength is effectively shortened, and the frequency components affected by the open stub increase. Therefore, the deterioration of the signal waveform of the high speed signal becomes more significant. In FIG. 3, propagation paths of the high speed signal Sg are indicated by arrows. As is clear from FIG. 3, in the printed board 3A of the embodiment of the present disclosure, in the signal terminal 35a, the inner edge 35aa of the signal terminal 35a protruding from a position of the through-hole via 33a closest to the ground line 35d toward a direction opposite to the end face 31c acts as an open stub for a high speed signal propagating through the signal line 32d and the signal terminals 32a, 35a. Similarly, in the signal terminal 35b, an inner edge 35ba of the signal terminal 35b (corresponding to the inner edge 35aa of the signal terminal 35a) protruding from a position of the through-hole via 33a closest to the ground line 35d toward a direction opposite to the end face 31c acts as an open stub with respect to a high speed signal propagating through the signal line 32e and the signal terminals 32b, 35b. If lengths of the open stubs are shortened, the frequency at which the influences of the capacitances of the open stubs become large can be raised. As a result, reflection of the frequency component of the high speed signal can be reduced, and waveform degradation of the high speed signal can be reduced.

Figure 9:
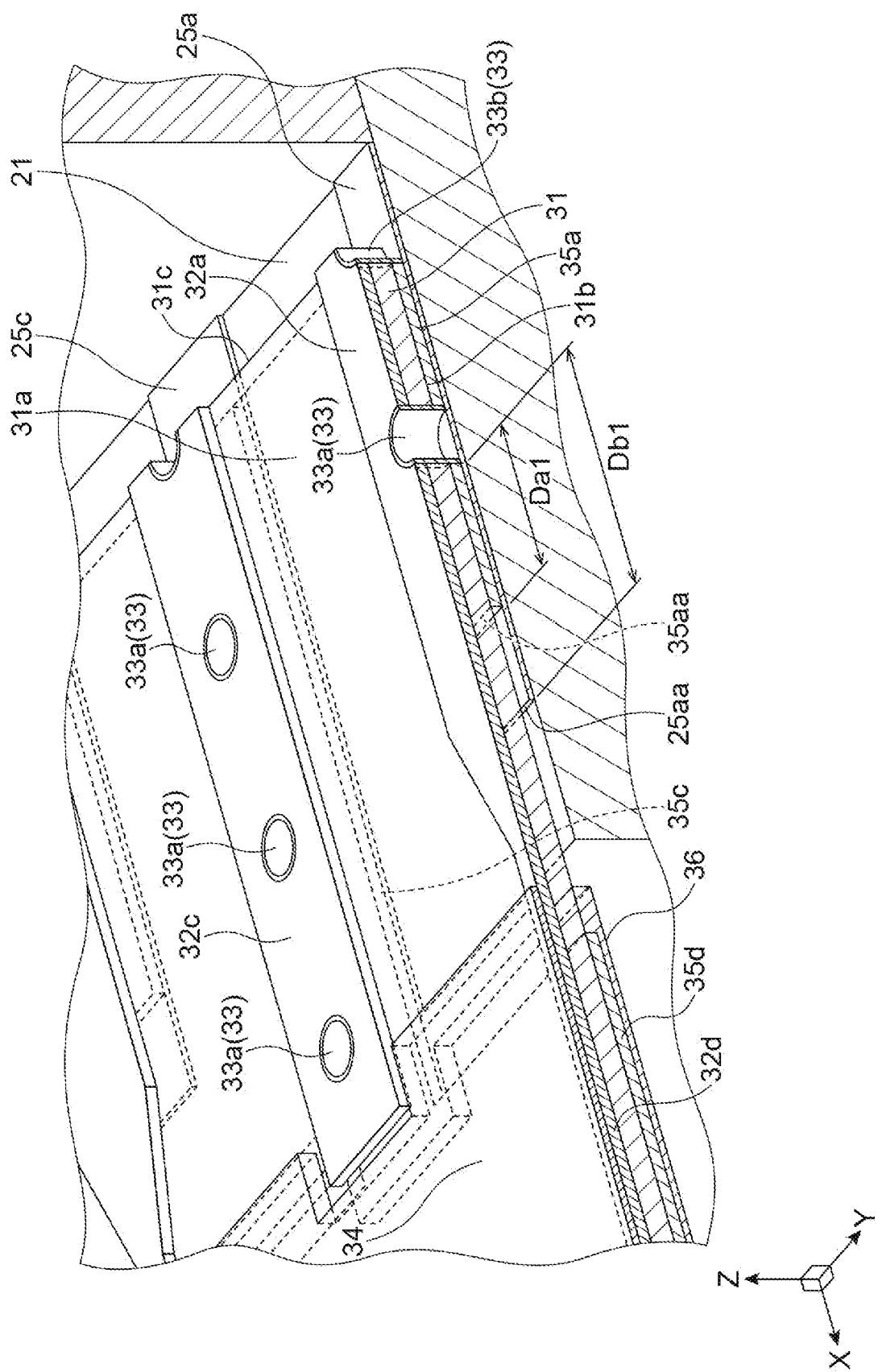
FIG. 9 is an enlarged perspective view showing, as a comparative example, a configuration in which a through-hole via farthest from an end face of a dielectric substrate among a plurality of through-hole vias between signal terminals shown in FIG. 3

FIG. 9 is an enlarged perspective view showing, as a comparative example, a configuration in which the through-hole via 33a closest to the inner edge 35aa of the signal terminal 35a is omitted from the two through-hole through-hole vias 33a electrically connecting the signal terminal 32a and the signal terminal 35a shown in FIG. 3 and FIG. 8. Therefore, in FIG. 9, in the planar view from the Z direction, the number of through-hole via 33a included in the one signal terminal 32a and in the signal terminal 35a opposite to the signal terminal 32a is one. In this case, the distance Da1 between the through-hole via 33a closest to the inner edge 35aa of the signal terminal 35a and the inner edge 35aa of the signal terminal 35a is greater than the distance Da1 shown in FIG. 3. Further, the distance Db1 between the through-hole via 33a closest to the end-surface edge 25aa of the signal terminal 25a and the end-surface edge 25aa of the signal terminal 25a is larger than the distance Db1 shown in FIG. 8.

Figure 10:
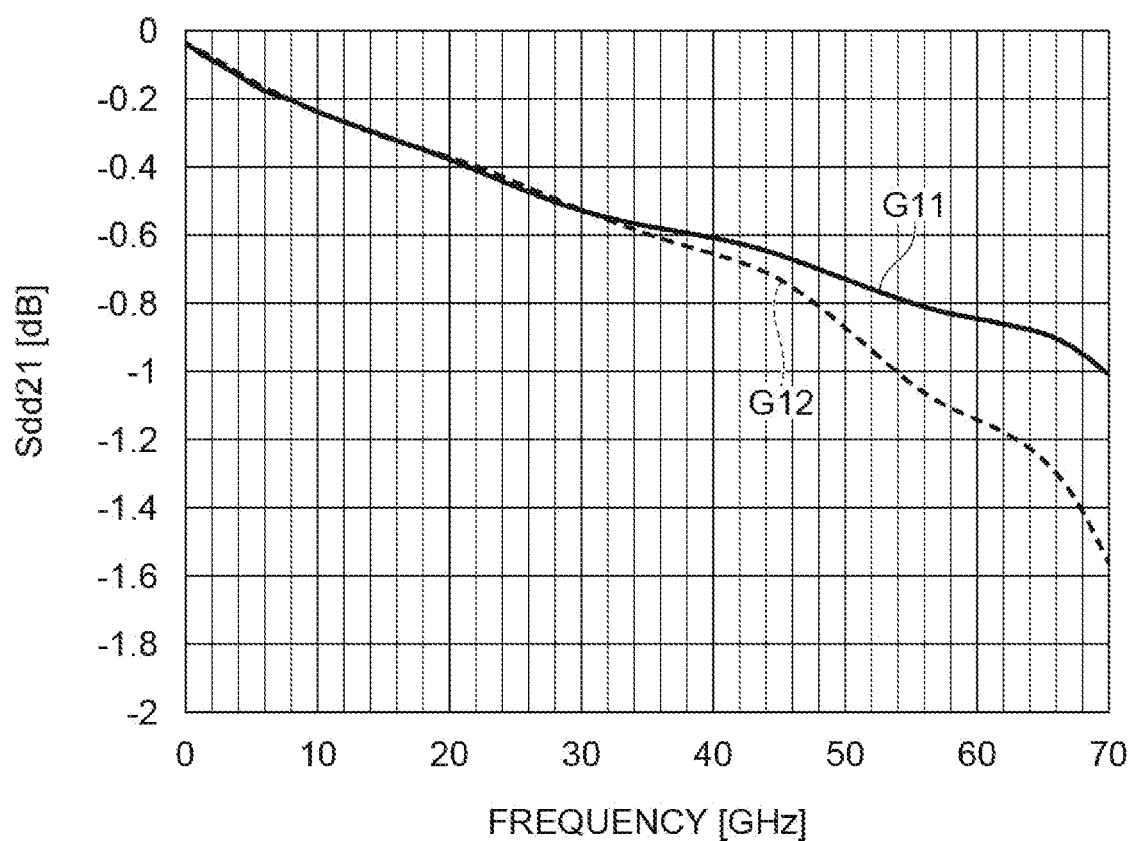
FIG. 10 is a graph showing simulation results of a differential-transmission characteristic Sdd21 in the configuration of the embodiment shown in FIG. 8 and the configuration of the comparative example shown in FIG. 9.

FIG. 10 is a graph showing simulation results of a differential-transmission characteristic Sdd21 in the configuration of the embodiment of the present disclosure shown in FIG. 8 and the configuration of the comparative example shown in FIG. 9. In FIG. 10, the vertical axis represents the differential-transmission characteristic Sdd21 (unit: dB) of a high speed signal, and the horizontal axis represents a frequency (unit: GHz). The differential-transmission characteristic Sdd21 represents, in decibels (dB), a ratio of a signal intensity of a frequency-component output from the signal line provided in the feed-through 20 to a signal intensity of the frequency-component of the differential signal input to the signal lines 32d and 32e. The differential-transmission characteristic Sdd21 corresponds to Sdd21 component of the differential-S parameter. If there is a loss in the transmission line on the way, the intensity of the output differential signal decreases, so that a value of the differential-transmission characteristic Sdd21 becomes smaller than 0 decibels. The value of the differential-transmission characteristic Sdd21 is preferably close to 0. FIG. 10 shows an effect of transmission line loss on the frequency components contained in the differential signal. The graph G11 shows the characteristics of the configuration of the embodiment of the present disclosure shown in FIG. 8 (distance Db1=60 μm), and the graph G12 shows the characteristics of the configuration of the comparative example shown in FIG. 9 (distance Db1=275 μm). Referring to FIG. 10, in the configuration of the embodiment of the present disclosure, the differential-transmission characteristic Sdd21 gradually decreases as the frequency increases, while in the configuration of the comparative example, the degree of decrease of the differential-transmission characteristic Sdd21 increases at frequencies equal to or higher than 30 GHz, and the differential-transmission characteristic Sdd21 rapidly decreases in a frequency band equal to or higher than 50 GHz. From this result, it can be seen that the distance Da1 between the through-hole via 33a closest to the inner edge 35aa and the inner edge 35aa greatly affects a signal-transmission characteristics in the frequency region equal to or higher than the 30 GHz. That is, when the distance Da1 increases, a portion of the distance Da1 of each of the signal terminals 35a and 35b acts as an open stub to decrease the frequency components equal to or higher than 30 GHz.

Figure 11:
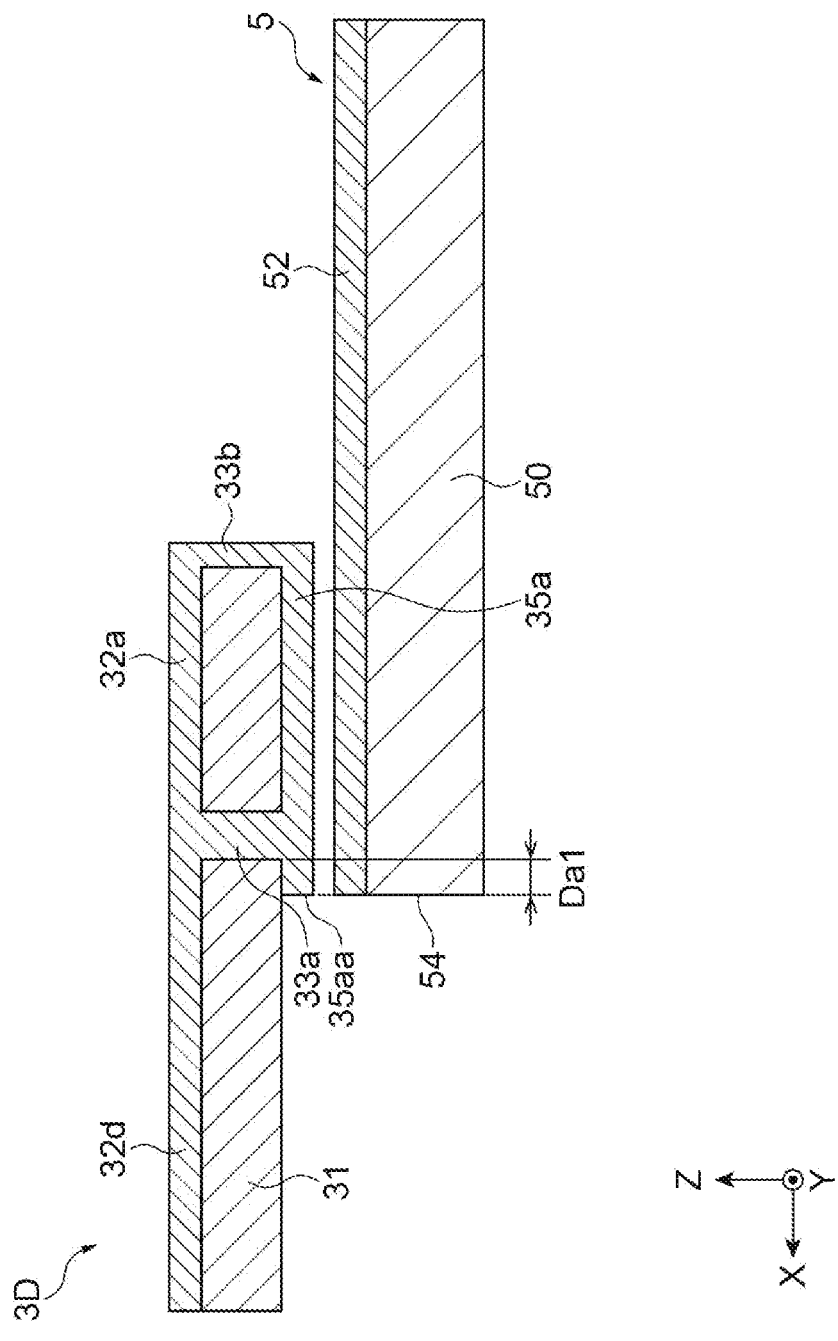
FIG. 11 illustrates a simulated model.

The present inventors further performed a simulation using a model shown in FIG. 11 in order to grasp a tendency of the signal-transmission characteristics in accordance with the distance Da1 between the inner edge 35aa and the through-hole via 33a closest to the inner edge 35aa. In this model, a printed board 3D and an assembly part 5 were connected to each other. The printed board 3D has one signal line 32d extending in the X direction and one signal terminal 32a connected to the signal line 32d on one surface of the dielectric layer 31, has one signal terminal 35a facing the signal terminal 32a on the other surface of the dielectric layer 31, and connects the signal terminal 32a and the signal terminal 35a by one through-hole via 33a and one half via 33b. In the assembly part 5, a wiring 52 extending in the X direction is provided on one surface of a dielectric substrate 50. The dielectric substrate 50 has an end surface 54. The end surface 54 is a leading surface of the dielectric substrate 50 in the X direction. The through-hole via 33a is provided between the end surface 54 and the half via 33b.

The wiring 52 is conductively joined to the signal terminal 35a. The position of the inner edge 35aa of the signal terminal 35a in the X direction is aligned with the position of an end-surface edge of the wiring 52 in the same direction. In FIG. 11, the signal terminal 35a and the wiring 52 are illustrated as being separated from each other in the Z direction, but the simulation was performed in a state where the signal terminal 35a and the wiring 52 were connected to each other. A portion of the wiring 52 that is conductively joined to the signal terminal 35a corresponds to the signal terminal 25a of the feed-through 20 (see FIGS. 4, 5, 6, 7, and 8).

Figure 12:
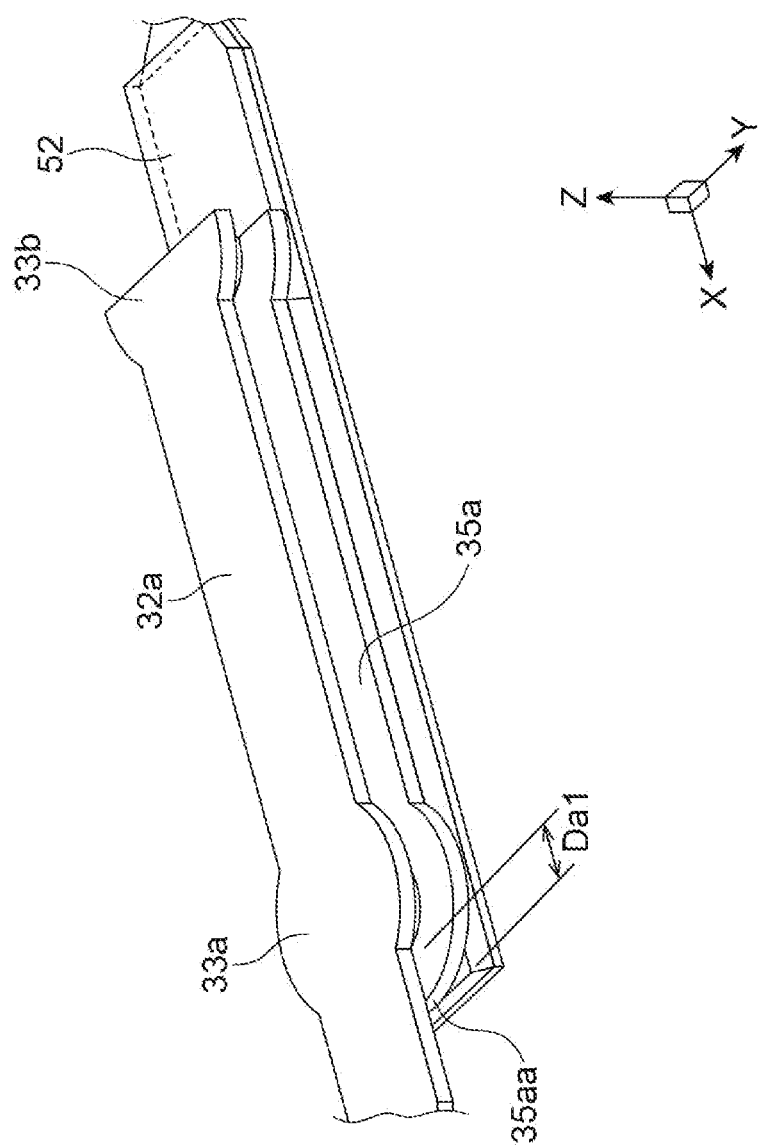
FIG. 12 is a perspective view showing a model in which a distance in the X direction between the through-hole via farthest from the end face of the dielectric substrate and the edge of the signal terminal is the smallest.
Figure 13:
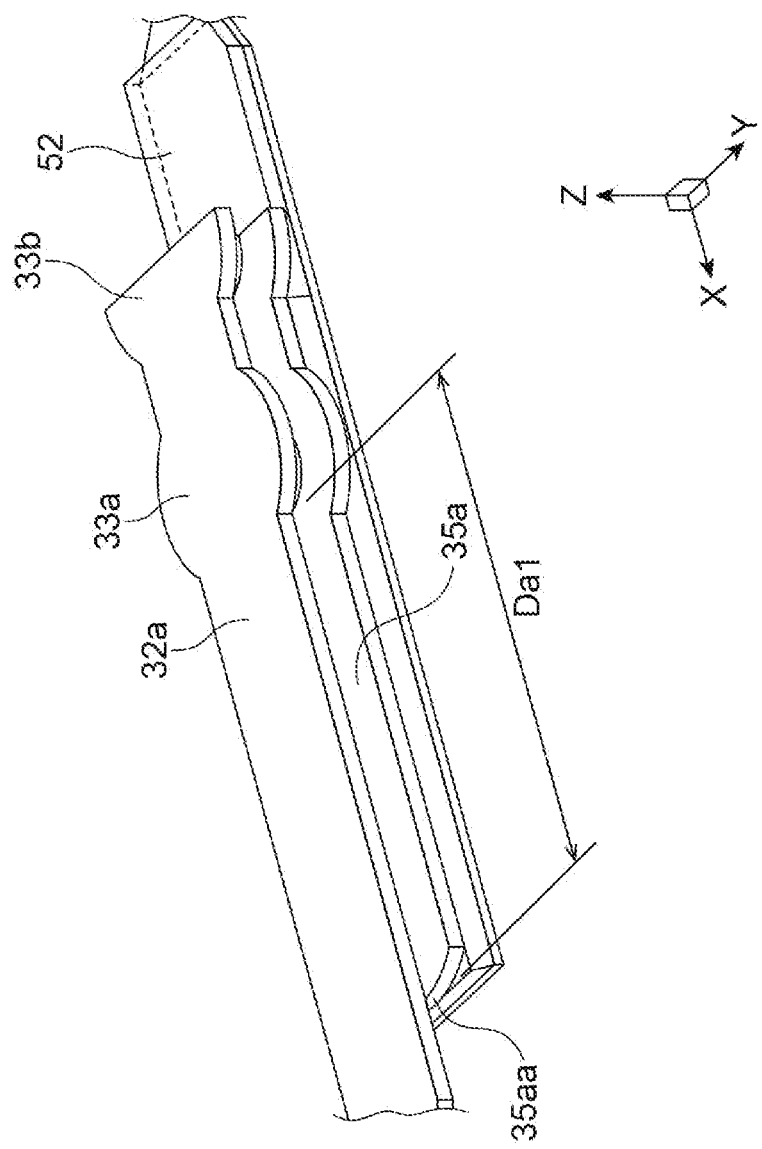
FIG. 13 is a perspective view showing a model in which the distance in the X direction between the through-hole via farthest from the end face of the dielectric substrate and the edge of the signal terminal is the largest.

FIG. 12 shows a model in which the distance Da1 in the X direction between the through-hole via 33a and the inner edge 35aa is the smallest in this simulation. In this case, the inner edge 35aa is an end in the X direction of an annular land pattern around the through-hole via 33a. FIG. 13 shows a model in which the distance Da1 is the largest in this simulation. In this simulation, the distance Da1 was set to 60 μm, 160 μm, 260 μm, 360 μm, 460 μm, or 560 μm. The relative dielectric constant of the dielectric layer 31 was set to 3.2 (an example of the relative dielectric constant of polyimide), and the relative dielectric constant of the dielectric substrate 50 was set to 9.0 (an example of the relative dielectric constant of alumina). When the distance Da1 is 60 μm, the inner edge 35aa is the end in the X direction of the annular land pattern around the through-hole via 33a (see FIG. 12).

In the study using this simulation, calculations are performed on an assumption that the relative dielectric constant of the dielectric layer 31 is 3.2, the relative dielectric constant of the dielectric substrate 50 is 9.0, and the effective relative dielectric constant at the signal terminal 32a and the signal terminal 35a, that is, at the junction section 30 is 6.1.

Note that the effective relative dielectric constant at the signal terminal 32a and the signal terminal 35a, that is, in the junction section 30 may be calculated based on the relative dielectric constant of the dielectric layer 31 and the relative dielectric constant of the dielectric substrate 50. For example, the effective relative dielectric constant at the signal terminal 32a and the signal terminal 35a, that is, in the junction section 30 may be obtained by averaging the relative dielectric constant of the dielectric layer 31 and the relative dielectric constant of the dielectric substrate 50. Further, the effective relative dielectric constant of the junction section 30 may be obtained in consideration of the shapes of the signal terminal 32a, the signal terminal 35a, the dielectric layer 31, and the dielectric substrate 50 in addition to the relative dielectric constants of the dielectric layer 31 and the dielectric substrate 50.

In addition, in a state where the signal terminal 32a and the signal terminal 35a are connected to the dielectric substrate 50, there is no difference in the influence of the relative dielectric constants described above, and propagation characteristics of the signal terminal 32a and the signal terminal 35a are considered to be equal to each other, so that the signal wavelength of the high speed signal propagating through the signal terminal 32a and the signal wavelength of the high speed signal propagating through the signal terminal 35a are substantially equal. That is, the signal wavelength of high speed signal in the signal terminal 32a are substantially equal to the signal wavelength in the signal terminal 35a.

For example, if the frequencies of the high speed signals (frequency components) propagating through the signal terminal 32a and the signal terminal 35a are 50 GHz, the signal wavelengths are calculated to be about 2,430 μm. In this case, the distance Da1 is preferably 304 μm or less, more preferably 152 μm or less. It is to be noted that 304 μm corresponds to a distance of one eighth of the signal wavelengths of the high speed signals (frequency components) having frequencies of 50 GHz in the signal terminals 32a, 35a. Further, 152 μm corresponds to a distance of one sixteenth of the signal wavelength of the high speed signals having a frequency of 50 GHz in the signal terminals 32a, 35a.

Further, for example, if the frequencies of the high speed signals (frequency components) propagating through the signal terminal 32a and the signal terminal 35a are 70 GHz, the signal wavelengths are calculated to be approximately 1,730 μm. In this case, the distance Da1 is preferably 216 μm or less, more preferably 108 μm or less. Note that 216 μm corresponds to a distance of one eighth of the signal wavelength of the high speed signals at the frequency of 70 GHz in the signal terminals 32a and 35a. Further, 108 μm corresponds to a distance of one sixteenth of the signal wavelength of the high speed signal at 70 GHz in the signal terminals 32a and 35a.

Figure 14:
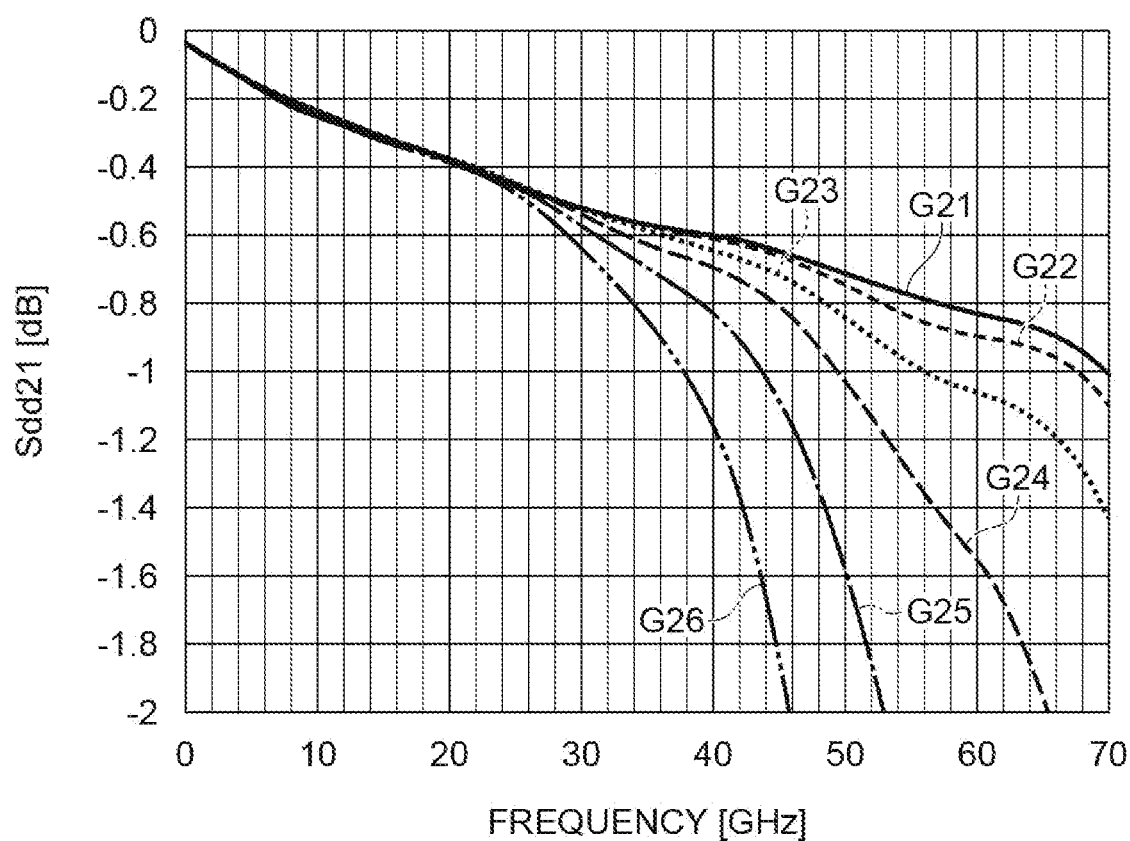
FIG. 14 is a graph showing simulation results of the differential-transmission characteristic Sdd21.

FIG. 14 is a graph showing results of this simulation. In FIG. 14, the vertical axis represents the differential-transmission characteristic Sdd21 (unit: dB), and the horizontal axis represents frequencies (unit: GHz). Graphs G21 to G26 show the cases where the distance Da1 is 60 μm, 160 μm, 260 μm, 360 μm, 460 μm and 560 μm respectively.

As shown in FIG. 14, as the distance Da1, that is a length of the open stub in the signal line 35a and the wiring 52 is smaller, the deterioration of the differential-transmission characteristic Sdd21 is reduced in a band at the signal-frequency of 30 GHz or higher, and the signal-transmission characteristic is improved.

For example, at the frequency of 50 GHz, the graphs of G21, G22, and G23 in which the distance Da1 is smaller than 304 μm which corresponds to one eighth of the signal wavelength, the decrease in the differential-transmission characteristic Sdd21 is suppressed compared to the graphs of G24, G25, and G26. In addition, at the frequency of 70 GHz, the graphs of G21 and G22 in which the distance Da1 is smaller than 216 μm, which is one eighth of the signal wavelength, the decrease in the differential-transmission characteristics Sdd21 is suppressed compared to the graphs of G23, G24, G25, and G26.

As described above, in particular, when the distance Da1 is equal to or smaller than one eighth of the signal wavelength, deterioration of the differential-transmission characteristic Sdd21 is reduced as compared with the case where the distance Da1 is larger than on eighth of the signal wavelength. Further, since the smaller the distance Da1, the more reduced the deterioration of the differential-transmission characteristic Sdd21, in case the distance Da1 is smaller than or equal to one sixteenth of the signal wavelength, the deterioration of the differential-transmission characteristic Sdd21 is reduced as compared with the case where the distance Da1 is larger than one sixteenth of the signal wavelength.

Figure 15:
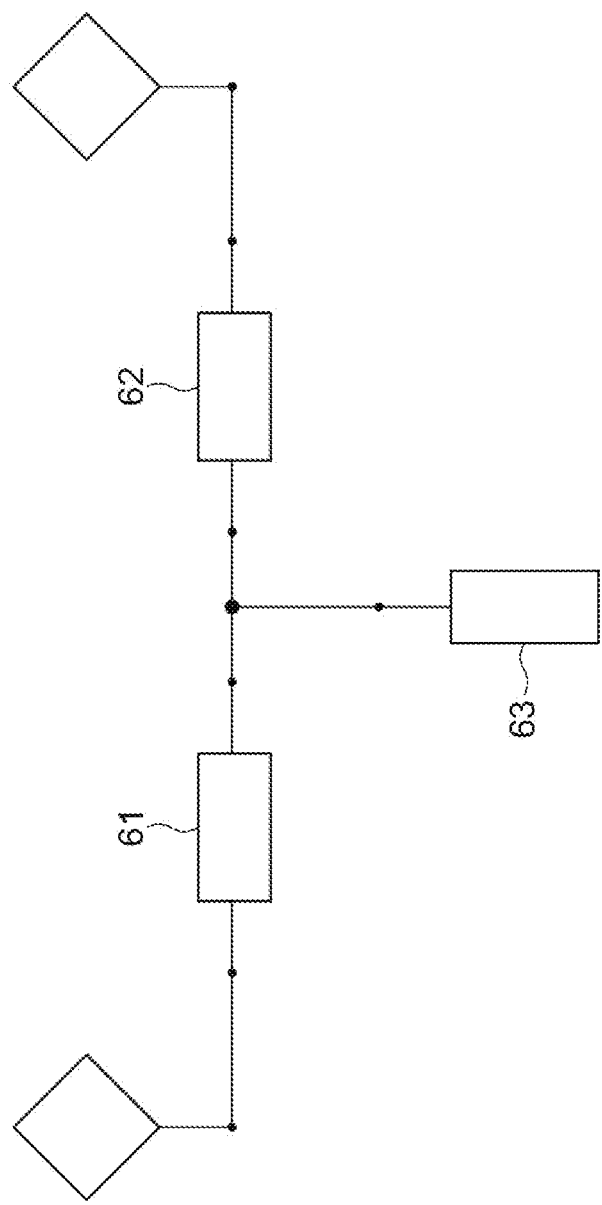
FIG. 15 is a diagram showing a circuit model used for a simulation.

In order to examine a relationship between the distance Da1 and the signal wavelength, a circuit model shown in FIG. 15 was simulated to examine a transmission characteristics S21 of high speed signals. The transmission characteristics S21 corresponds to a S21 component of S-parameters of single-phase signals. The circuit model shown in FIG. 15 includes a stub 63 having a predetermined length between two ideal transmission lines 61 and 62. Each length of the ideal transmission lines 61, 62 is set to a sufficiently short value (for example, 100 μm or the like) with respect to the signal wavelength so that the lengths of the ideal transmission lines 61, 62 were assumed to have no effect on the transmission characteristics.

Figure 16:
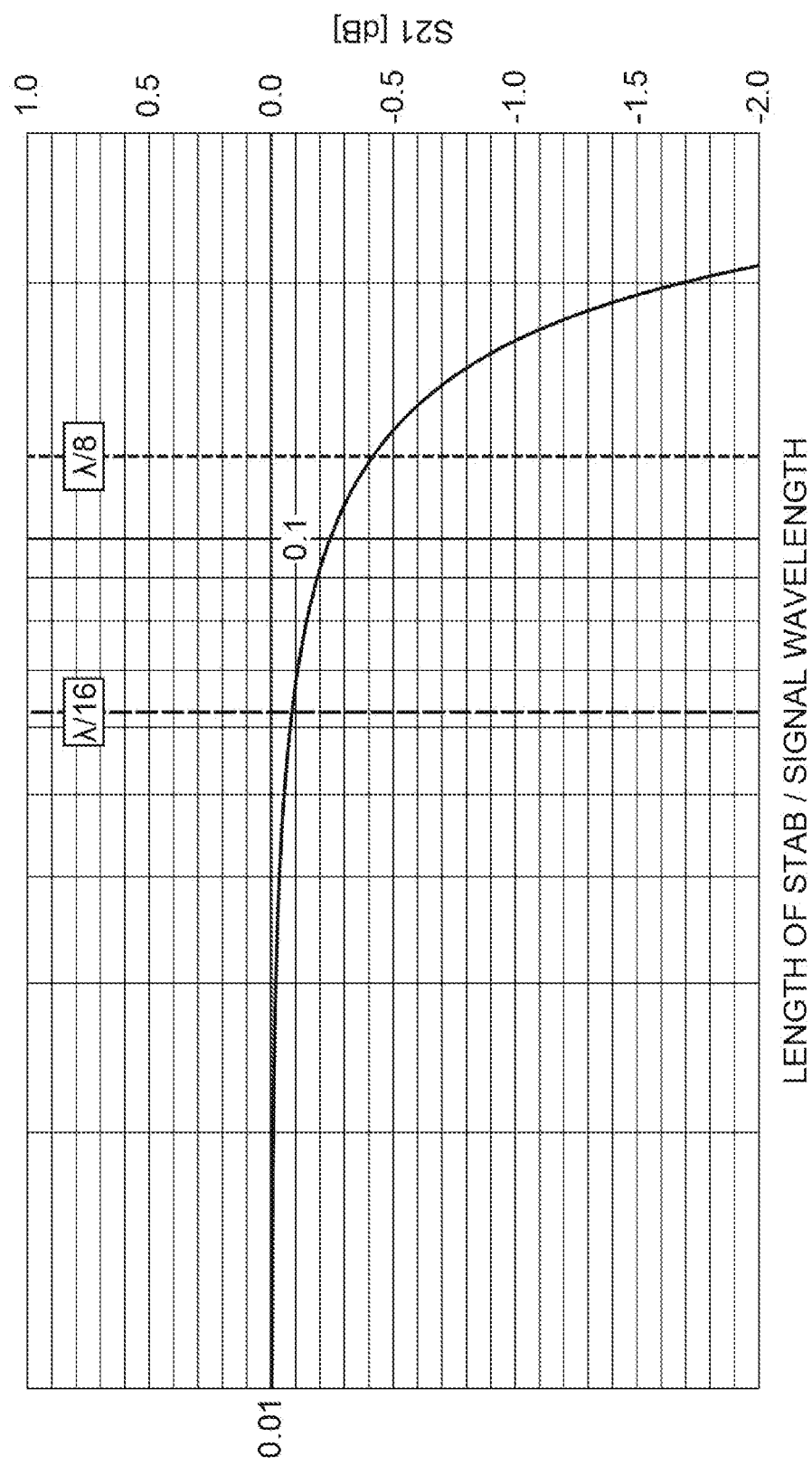
FIG. 16 is a graph showing a simulation result for the circuit model of FIG. 15.

FIG. 16 is a graph showing a result of the simulation of the circuit model of FIG. 15. In FIG. 16, the vertical axis represents transmission characteristics S21 (unit: dB), and the horizontal axis represents a value (unit: dimensionless) obtained by dividing the length of the stub 63 by signal wavelengths. Further, the graph shows a case where the stub 63 has the length of 300 μm.

From the result of FIG. 16, when the length of stub 63 is one eighth or less of the signal wavelength, the loss is −0.5 dB or less (the value of S21 is greater than −0.5 dB). When the length of the stub 63 is one sixteenth or less of the signal wavelength, the loss is −0.1 dB or less (the value of S21 is larger than −0.1 dB). Thus, in the embodiment of the present disclosure, if the distance Da1 (see FIG. 3) is equal to or less than one eighth of the signal wavelengths, the loss due to the stub is suppressed. Further, when the distance Da1 (see FIG. 3) is equal to or less than one sixteenth of the signal wavelength, the loss due to the stub is further suppressed.

From this, it can be understood that, in the embodiment of the present disclosure, when the distance Da1 (see FIG. 3) is equal to or less than one eighth of the signal wavelength, the deterioration of the waveform of the high speed signal is reduced. Further, it is understood that the deterioration of the waveform of the high speed signal is further reduced when the distance Da1 is equal to or less than one sixteenth of the signal wavelength.

Regarding the signal terminal 32a of the embodiment of the present disclosure, since the through-hole 33 closest to the end face 31c is the half via 33b, it can be said that a distance (first distance) between an edge closest to the end face 31c among both edges of the signal terminal 32a in the X direction and the through-hole via 33 closest to the end surface 31c is 0. In this case, as can be seen from the propagation paths of the high speed signal shown in FIG. 3, no open stub occurs in the signal terminal 32a. Therefore, deterioration of the waveform of the high speed signal due to the open stub does not occur in the signal terminal 32a.

As described above, the frequencies of the signals supplied to the signal lines 32d and 32e may be equal to or higher than 30 GHz, or equal to or higher than 50 GHz. The printed board 3A of the embodiment of the present disclosure is particularly useful when the signals supplied to the signal lines 32d and 32e are the high speed signals having frequency components of frequencies higher than or equal to 30 GHz.

As described above, in a state in which the signal terminal 25a is conductively joined to the signal terminal 35a, the distance Db1 between the end-surface edge 25aa of the signal terminal 25a near the end surface 24 in the X direction and the through-hole via 33a closest to the end-surface edge 25aa may be equal to or less than one eighth of the signal wavelength. Since the signal terminal 25a is conductively joined facing to the signal terminal 35a, the portion of the signal terminal 25a protruding from the through-hole via 33a also acts as an open stub for high speed signals. Therefore, since the distance Db1 is less than or equal to one eighth of the signal wavelength, the open stub caused by the signal terminal 25a can be decreased, thereby reducing the deterioration of the waveform of the high speed signals.

As described above, the assembly part joined to the printed board 3A may be the package 10A that houses at least one element of the optical module 1A including at least one element of the light reception element and the light emitting element. In this case, it is possible to provide the optical module 1A capable of reducing deterioration of each waveform of a high speed signal output from the light emitting element or a high speed signal input to the light reception element.

First Modification

Figure 17:
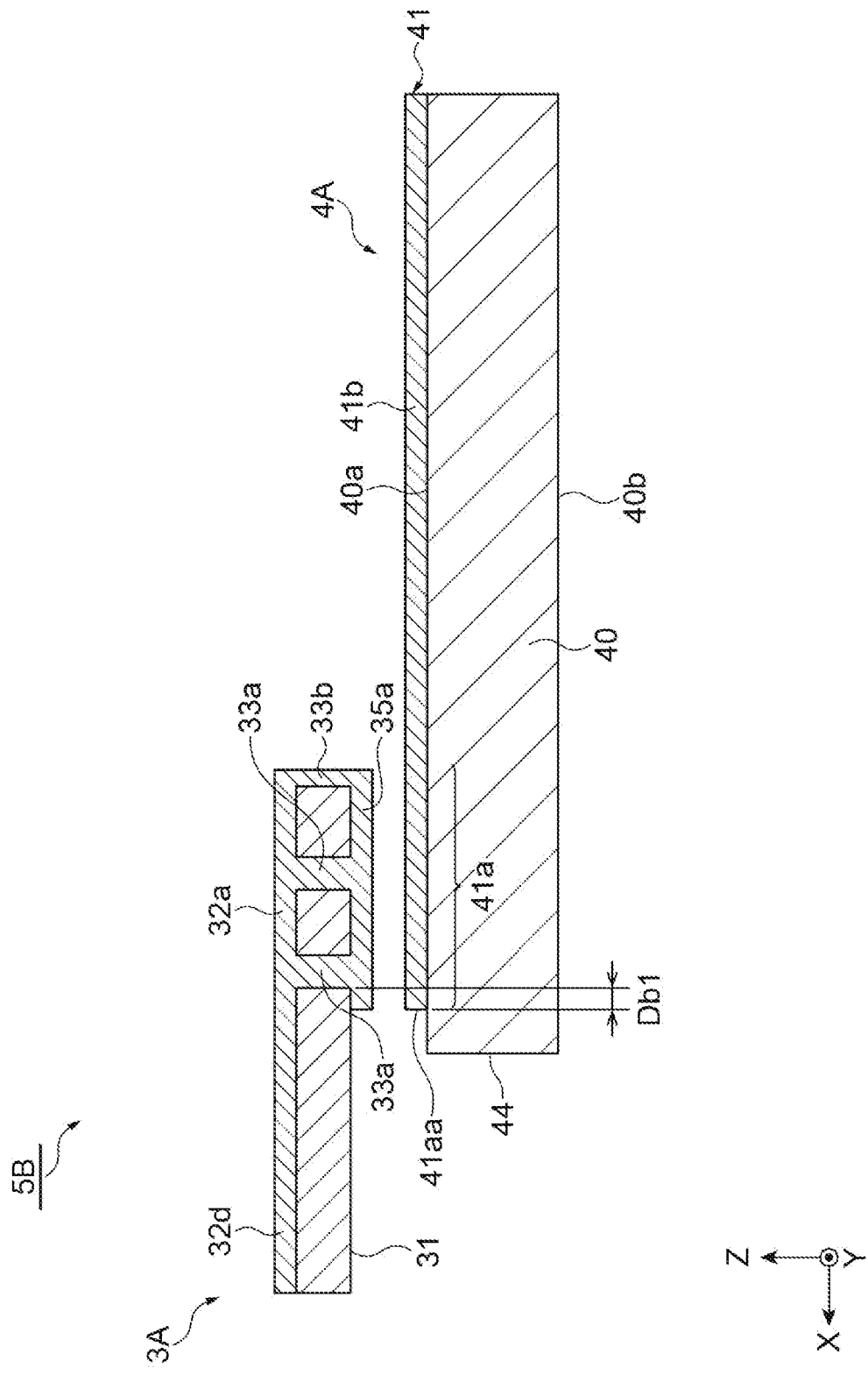
FIG. 17 is a cross-sectional view illustrating a configuration of a printed board assembly according to a first modification.

FIG. 17 is a cross-sectional view showing a configuration of a printed board assembly 5B according to a first modification of the embodiment. The printed board assembly 5B of this modification includes a printed board 4A as the assembly part in place of the optical module 1A of the above embodiment. The printed board 4A includes a dielectric substrate 40 and a wiring layer 41. The dielectric substrate 40 is a plate-shaped member having a main surface 40a and a back surface 40b, and mainly includes a dielectric material such as epoxy. A thickness direction of the dielectric substrate 40 coincides with the Z direction. The dielectric substrate 40 also has an end surface 44. The end surface 44 intersects both the main surface 40a and the back surface 40b. The end surface 44 is a leading surface of the dielectric substrate 40 in the X direction. The wiring layer 41 is a layer including a metallic film provided on the main surface 40a. The wiring layer 41 corresponds to a third wiring layer in the present disclosure.

The wiring layer 41 includes a signal terminal 41a and a signal line 41b. The signal terminal 41a extends along the X direction in the vicinity of an end portion of the dielectric substrate 40 in the X direction. The signal terminal 41a faces the signal terminal 35a of the printed board 3A, and is conductively joined to the signal terminal 35a by solder or the like. The signal line 41b is connected to the signal terminal 41a and extends on the main surface 40a. The signal terminal 41a is provided between the end surface 44 and the signal line 41b. The wiring layer 41 further includes a signal terminal (not shown) facing the signal terminal 35b of the printed board 3A and conductively joined to the signal terminal 35b by solder or the like, and a signal line connected to the signal terminal. Therefore, the wiring layer 41 includes the signal line 41b (see FIG. 17) conductively connected to the signal terminal 35a and the signal line (not shown) conductively connected to the signal terminal 35b. The wiring layer 41 further includes a ground terminal (not shown) that faces the ground terminal 35c of the printed board 3A and is conductively joined to the ground terminal 35c by solder or the like, and a ground line connected to the ground terminal. An arrangement and shapes of these terminals including the signal terminal 41a may be similar to the arrangement and shapes of the signal terminals 25a, 25b, and the ground terminal 26 in the above embodiment. In FIG. 17, the signal terminal 35a and the signal terminal 41a are illustrated as being separated from each other in the Z direction, but in the actual printed board assembly 5B, both are connected to each other.

In this modification, the distance Db1 in the X direction between an end-surface edge 41aa of the signal terminal 41a closer to the end surface 44 and the through-hole via 33a closest to the end-surface edge 41aa is less than or equal to one eighth of the signal wavelength, and more preferably less than or equal to one sixteenth of the signal wavelength. In this case, an open stub caused by the signal terminal 41a is reduced and the signal-transmission characteristic is improved, so that the deterioration of the waveform of the high speed signal can be suppressed.

Second Modification

Figure 18:
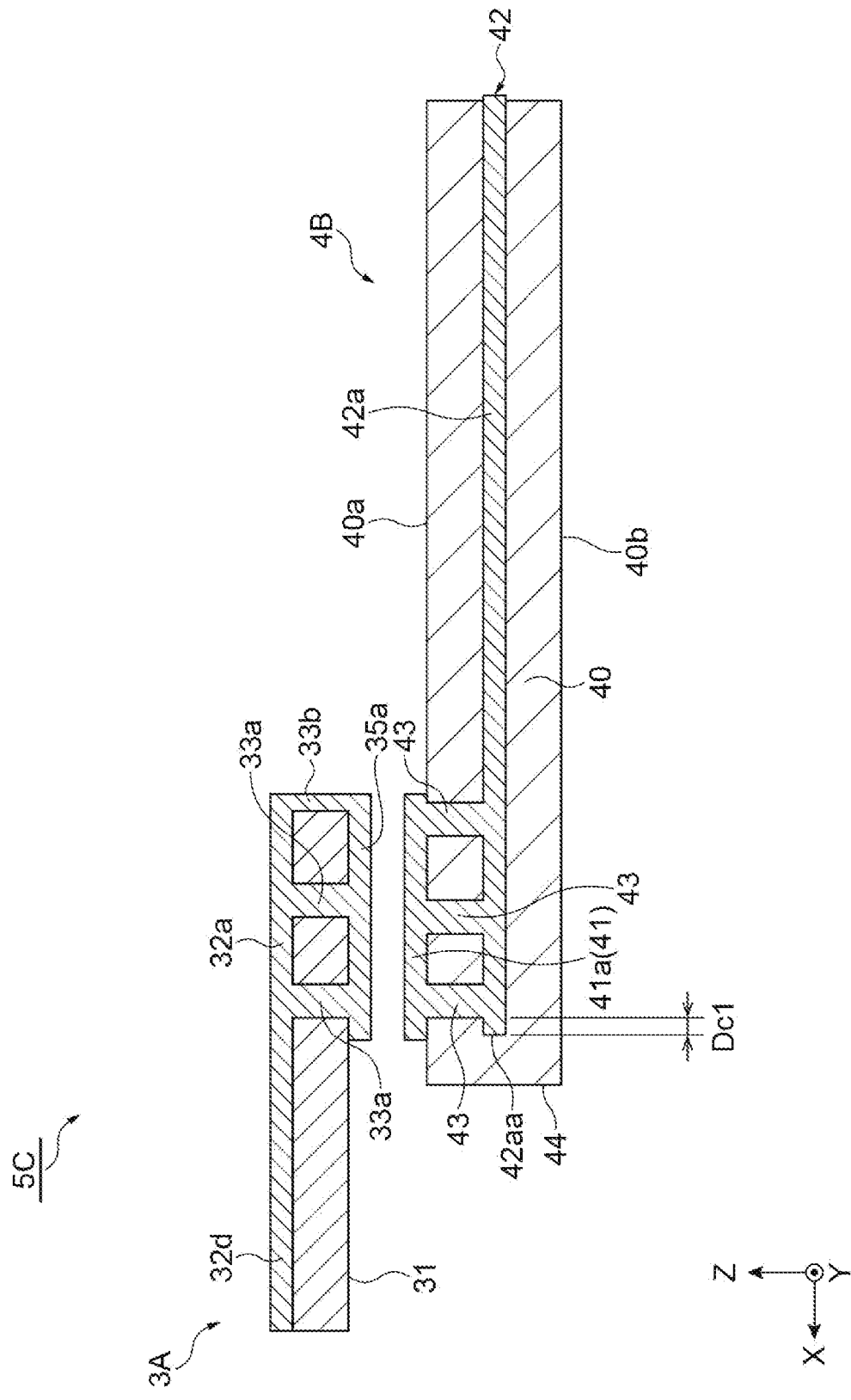
FIG. 18 is a cross-sectional view illustrating a configuration of a printed board assembly according to a second modification.

FIG. 18 is a cross-sectional view showing a configuration of a printed board assembly 5C according to a second modification of the embodiment. The printed board assembly 5C of this modification includes a printed board 4B as an assembly part in place of the optical module 1A of the above embodiment. The printed board 4B includes the dielectric substrate 40, the wiring layer 41, and a wiring layer 42. The dielectric substrate 40 is a plate-shaped member having the main surface 40a and the back surface 40b, and mainly includes a dielectric material such as epoxy. The thickness direction of the dielectric substrate 40 coincides with the Z direction. The wiring layer 41 is a layer including a metallic film provided on the main surface 40a. The wiring layer 42 is a layer including a metallic film provided inside the dielectric substrate 40, that is, provided between the main surface 40a and the back surface 40b. The wiring layer 42 is not limited to this form and may be provided on the back surface 40b. The dielectric substrate 40 is interposed between the wiring layer 41 and the wiring layer 42. The wiring layer 41 corresponds to the third wiring layer in the present disclosure. The wiring layer 42 corresponds to a fourth wiring layer in the present disclosure. A portion of the dielectric substrate 40 located between the wiring layer 41 and the wiring layer 42 corresponds to a second dielectric layer in the present disclosure.

The wiring layer 41 includes the signal terminal 41a. The signal terminal 41a extends along the X direction in the vicinity of an end portion of the dielectric substrate 40 in the X direction. The signal terminal 41a faces the signal terminal 35a of the printed board 3A, and is conductively joined to the signal terminal 35a by solder or the like. The signal terminal 41a corresponds to a third signal terminal in the present disclosure. The wiring layer 41 further includes a signal terminal (not shown) that faces the signal terminal 35b of the printed board 3A and is conductively joined to the signal terminal 35b by solder or the like. Therefore, the wiring layer 41 includes the signal terminal 41a (see FIG. 18) conductively connected to the signal terminal 35a and the signal terminal (not shown) conductively connected to the signal terminal 35b. In addition, the wiring layer 41 further includes a ground terminal (not shown) facing the ground terminal 35c of the printed board 3A and conductively connected to the ground terminal 35c by solder or the like.

The wiring layer 42 includes a signal line 42a. The signal line 42a extends in a plane parallel to the main surface 40a inside the dielectric substrate 40. An end portion of the signal line 42a faces the signal terminal 41a in the Z direction with a part of the dielectric substrate 40 interposed therebetween. The signal line 42a corresponds to a second signal line in the present disclosure. The wiring layer 42 further includes a signal line (not shown) facing the signal terminal of the wiring layer 41 connected to the signal terminal 35b of the printed board 3A, and includes a ground line (not shown) facing the ground terminal of the wiring layer 41 connected to the ground terminal 35c of the printed board 3A.

The printed board 4B further includes a plurality of through-hole vias 43. The plurality of through-hole vias 43 are conductive internal wirings extending in the Z direction, are arranged side by side in the X direction between the signal terminal 41a and the signal line 42a, and electrically connect the signal terminal 41a and the signal line 42a. In addition, a distance Dc1 (fourth distance) between an end-surface edge 42aa of the signal line 42a closer to the end surface 44 in the X direction and the through-hole via 43 closest to the end-surface edge 42aa of the signal line 42a (fourth through-hole via) among the plurality of through-hole vias 43 electrically connecting the signal terminal 41a and the signal line 42a is equal to or less than one eighth of the signal wavelength. In this case, the open stub generated in the signal line 42a can be decreased to reduce the deterioration of the waveform of the high speed signal. Similarly, a plurality of through-hole vias are provided between the signal terminal of the wiring layer 41 connected to the signal terminal 35b and the signal line of the wiring layer 42 facing the signal terminal. Further, a plurality of through-hole vias are similarly provided between the ground terminal of the wiring layer 41 connected to the ground terminal 35c and the ground line of the wiring layer 42 facing the ground terminal. In FIG. 18, the signal terminal 35a and the signal terminal 41a are illustrated as being separated from each other in the Z direction, but in the actual printed board assembly 5C, both are connected to each other.

Third Modification

Figure 19:
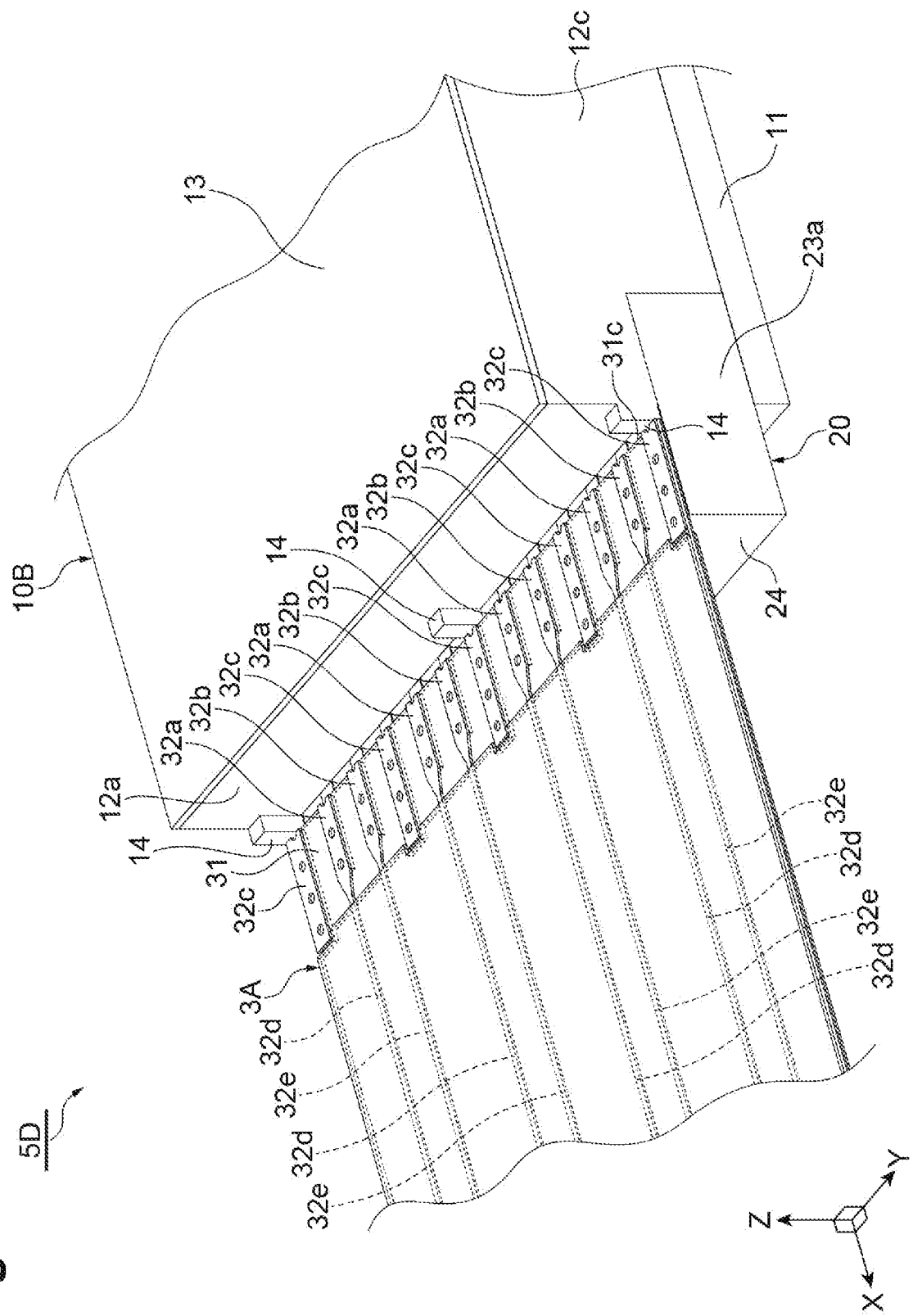
FIG. 19 is an enlarged perspective view of a portion of a printed board assembly according to a third modification.
Figure 20:
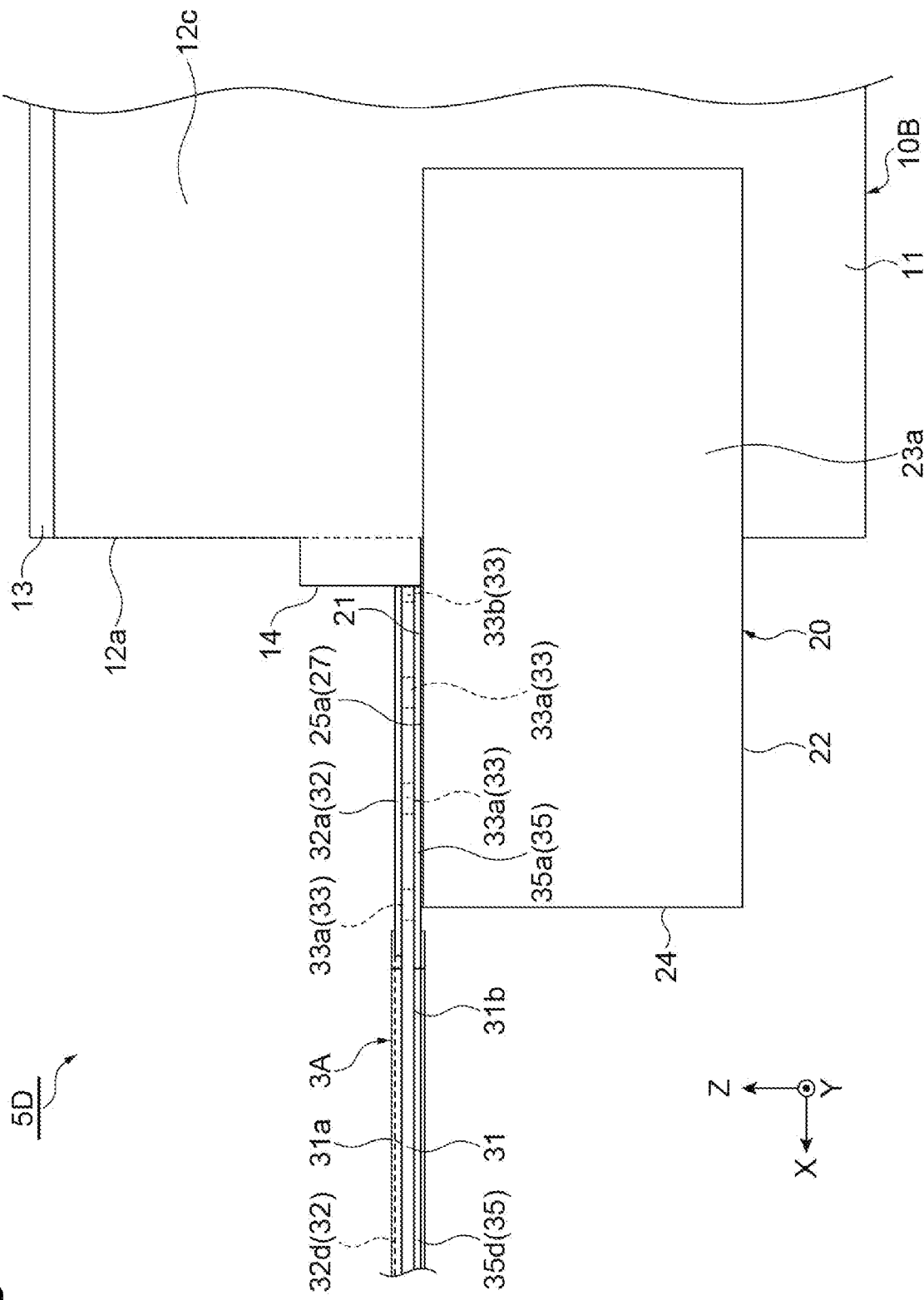
FIG. 20 is a side view of a portion of a printed board assembly of the third modification.

FIG. 19 is an enlarged perspective view showing a part of a printed board assembly 5D according to a third modification of the embodiment. FIG. 20 is a side view of a portion of the printed board assembly 5D according to this modification. The printed board assembly 5D of this modification includes a package 10B as an assembly part in place of the package 10A of the above embodiment. The package 10B further includes protrusions 14 in addition to the configuration of the package 10A of the above embodiment. The protrusions 14 are protruding parts provided at both ends in the Y direction of the front surface 12a of the package 10B. The protrusion 14 extends in the Z direction from the main surface 21 of the feed-through 20. The protrusion 14 protrudes from the front surface 12a toward the front in the X direction (i.e. toward the printed board 3A).

A top surface of the protrusion 14 abuts the end face 31c of the printed board 3A. Thus, the printed board 3A and the package 10B are positioned relative to each other in the X direction. The protrusion 14 corresponds to a positioning member in the present disclosure. According to this modification, the relative position in the X direction between the through-hole via 33a closest to the inner edge 35aa of the signal terminal 35a and the end-surface edge 25aa of the signal terminal 25a can be accurately positioned. Therefore, it is possible to suppress an increase in open stub due to the signal terminal 25a caused by an assembly error. The package 10B may further have the protrusion 14 between the protrusions 14 provided at both ends of the front surface 12a in the Y direction. The protrusions 14 may extend from the main surface 21 of the feed-through 20 to the same position as the top plate 13 in the Z direction.

Further, as in the present modification, the positioning member may be a portion which is provided in the package 10B as the assembly part and abuts on the end face 31c. In this case, it is possible to easily match positions of the printed board 3A and the package 10B in the X direction with a simple configuration.

Fourth Modification

Figure 21:
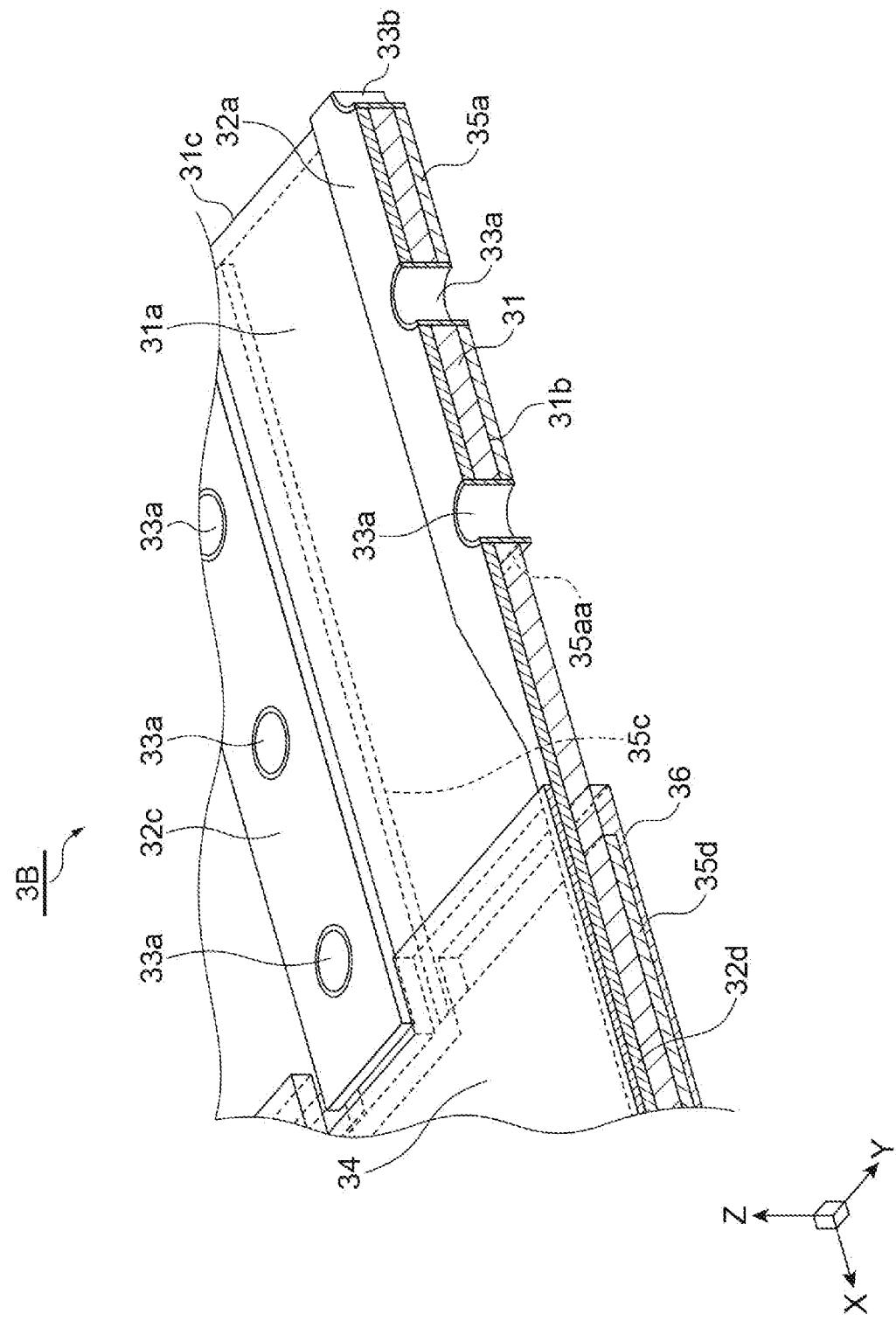
FIG. 21 is an enlarged perspective view showing a portion of a printed board according to a fourth modification.

FIG. 21 is an enlarged perspective view showing a portion of a printed board 3B according to a fourth modification of the embodiment. In the printed board 3B of this modification, the position of the inner edge 35aa of the signal terminal 35a in the X direction coincides with an edge of the through-hole via 33a closest to the inner edge 35aa. That is, the distance (shortest distance) Da1 between the inner edge 35aa and the through-hole via 33a closest to the inner edge 35aa is zero. Therefore, the land pattern mentioned above is omitted in the signal terminal 35a. The signal terminal 35b also has a similar configuration to the signal terminal 35a. In such a case, the open stubs generated in the signal terminals 35a and 35b are eliminated, and the deterioration of the waveform of the high speed signal can be further reduced. For example, when one of the feed-through 20, the printed board 4B, or the printed board 4A is assembled to form an assembly part, the position of the end-surface edge 25aa of the signal terminal 25a (see FIG. 8), the position of the end-surface edge 41aa of the signal terminal 41a (see FIG. 17), and the position of the end-surface edge 42aa of the signal line 42a (see FIG. 18) coincide with the position of the inner edge 35aa of the signal terminal 35a (see FIG. 3) in the X direction.

Fifth Modification

Figure 22:
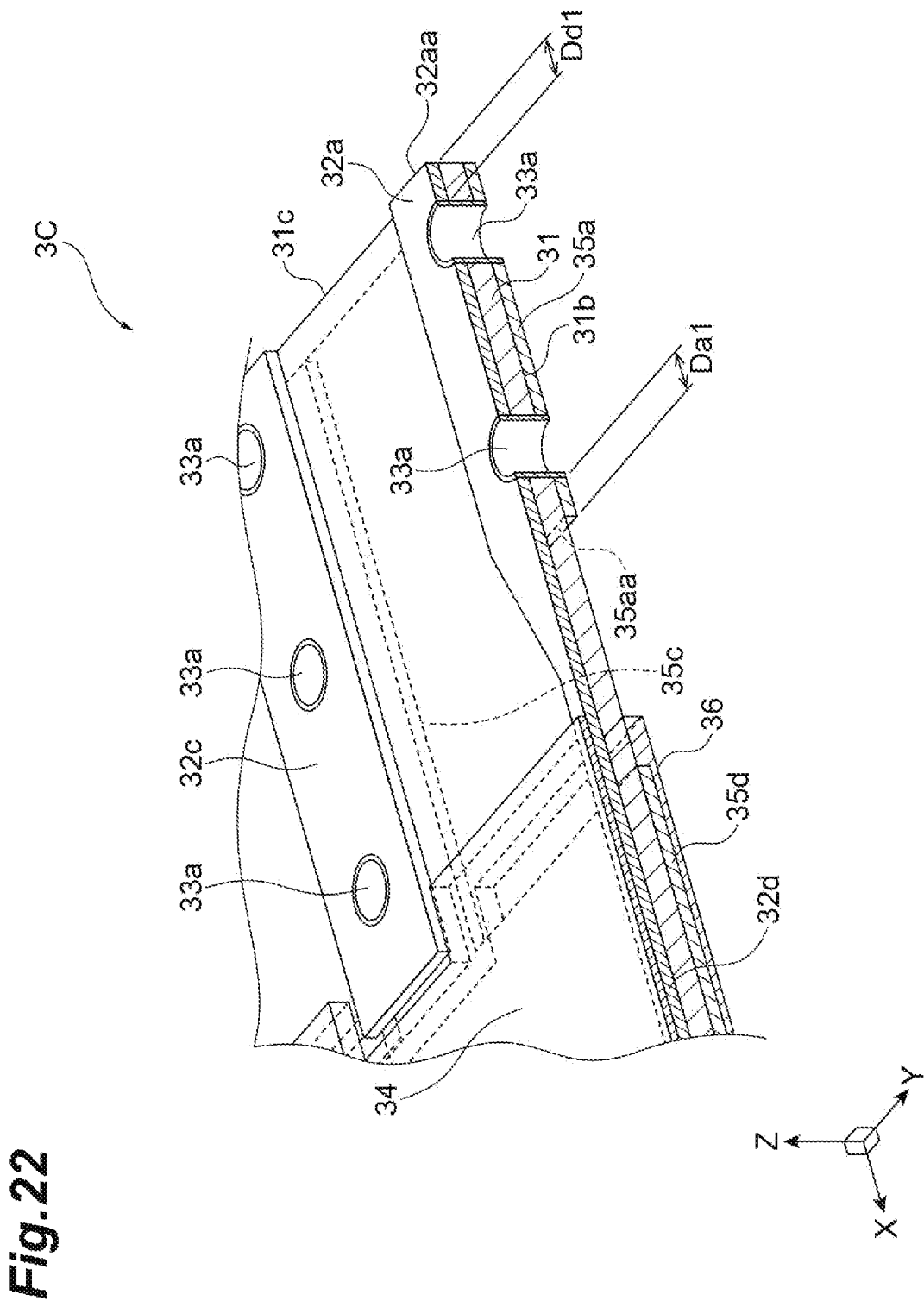
FIG. 22 is an enlarged perspective view showing a portion of a flexible wiring board according to a fifth modification.

FIG. 22 is an enlarged perspective view showing a portion of a printed board 3C according to a fifth modification of the embodiment. This printed board 3C is different from the printed board 3A of the above embodiment in that the half via 33b is not provided. A distance Dd1 (first distance) between an end-face edge 32aa closer to the end face 31c among two edges of the signal terminal 32a in the X direction and the through-hole via 33a closest to the end-face edge 32aa (first through-hole via) among the plurality of through-hole vias 33a is one eighth or less, or more preferably one sixteenth or less of the wavelengths of signals propagating through the signal line 32d. The plurality of through-hole vias 33a are included in one signal terminal 32a and in the signal terminal 35a opposite to the signal terminal 32a in the planar view from the Z direction. The signal terminal 32b also has a configuration similar to that of the signal terminal 32a described above.

In the printed board 3C of the present modification, the end-face edges of the signal terminals 32a and 32b (end-face edge 32aa in the case of the signal terminal 32a) protruding from the position of the through-hole via 33a toward the end face 31c act as open stubs for high speed signals propagating through the signal lines 32d and 32e. Therefore, by setting the distance Dd1 to one eighth or less (more preferably one sixteenth or less) of the signal wavelengths, the open stubs generated in the signal terminals 32a and 32b can be reduced, the signal-transmission characteristics can be improved, and the deterioration of the waveforms of the high speed signals can be reduced.

Printed boards and printed board assemblies according to the present disclosure are not limited to the embodiments described above, and various other modifications are possible. For example, although the packages 10A and 10B of the optical modules and the printed boards 4A and 4B are exemplified as the assembly parts in the above embodiment and each modification, the assembly part in the present disclosure is not limited thereto, and various devices having a signal terminal similar to the signal terminal 35a or 41a can be used as the assembly part.

In addition, although a flexible printed circuit is exemplified as the printed board of the present disclosure in the above embodiment and each modified example, the printed board of the present disclosure may be a so-called rigid substrate in which a dielectric layer does not have flexibility.

The signal wavelength is determined by a bandwidth required for waveform quality according to an intensity distribution (spectrum) of a frequency component of a high speed signal. For example, when NRZ (Non-Return-to-Zero) signal having a transfer rate of 40 Gbps or PAM (Pulse Amplitude Modulation)-4 signal having a modulation rate of 20 GBaud are propagated as a high speed signal, the signal wavelength is calculated based on the frequency of 40 GHz and the relative dielectric constants described above in order to reduce losses due to the influence of open stubs of the frequency component at frequency of 40 GHz. In order to further improve the waveform quality of the high speed signal, frequencies of 70% to 80% of 40 GHz, for example, 30 GHz may be selected. In this case, the signal wavelength is calculated based on the frequency of 30 GHz and the relative dielectric constants described above. The higher the frequency, the shorter the signal wavelength. Further, for example, when NRZ (Non-Return-to-Zero) signals having a transfer rate of 100 Gbps or PAM (Pulse Amplitude Modulation)-4 signals having a modulation rate of 50 GBaud are propagated, the signal wavelength is calculated based on the frequency of 100 GHz and the relative dielectric constants described above in order to reduce losses due to the influence of open stubs of the frequency component having the frequency of 100 GHz. In order to further improve the waveform quality of the high speed signal, frequencies of 70% to 80% of 100 GHz, for example, 70 GHz may be selected. In this case, the signal wavelength is calculated based on the frequency of 70 GHz and the relative dielectric constants described above.

What is claimed is:

1. A printed board having a junction section at an end portion in a first direction, the printed board comprising:
   a first wiring layer including a first terminal and a first signal line, the first terminal being placed in the junction section, the first signal line being connected to the first terminal;

a second wiring layer including a second terminal placed away from the first terminal in a thickness direction intersecting the first direction, the second terminal facing to the first terminal;

a first dielectric layer interposed between the first wiring layer and the second wiring layer, the first dielectric layer having an end face in the end portion, the end face extending in a second direction intersecting both the first direction and the thickness direction; and a plurality of through-hole vias configured to electrically connect the first terminal and the second terminal to each other, the plurality of through-hole vias being placed along the first direction inside the first terminal and the second terminal in a planer view from above in the thickness direction, wherein the plurality of through-hole vias includes a first through-hole via and a second through-hole via, the first through-hole via being closest to an end-face edge of the first terminal in the first direction, the second through-hole via being closest to an inner edge of the second terminal in the first direction, the end-face edge being closer to the end face than the inner edge in the first direction, wherein the first through-hole via has a first distance between the first through-hole via and the end-face edge of the first terminal, the first distance being set to be equal to or smaller than one eighth of a signal wavelength of a high speed signal transmitted through the first terminal, and wherein the second through-hole via has a second distance between the second through-hole via and the inner edge of the second terminal, the second distance being set to be equal to or smaller than one eighth of a signal wavelength of the high speed signal transmitted through the second terminal.

2. The printed board according to claim 1, wherein the signal wavelength of the high speed signal transmitted through the first terminal and the signal wavelength of the high speed signal transmitted through the second terminal are determined for the high speed signal having a frequency component at a frequency of 30 GHz or more.

3. The printed board according to claim 1, wherein the first through-hole via has the first distance set to one sixteenth or smaller of the signal wavelength of the high speed signal transmitted through the first terminal.

4. The printed board according to claim 1, wherein the first through-hole via is formed on the end face as a half via and the first through-hole via has an inside exposed to an outside of the first through-hole via.

5. The printed board according to claim 1, wherein the second through-hole via has the second distance set to one sixteenth or smaller of the signal wavelength of the high speed signal transmitted through the second terminal.

6. The printed board according to claim 1, wherein the first dielectric layer is formed of a resin film having flexibility.

7. A printed board assembly comprising:

the printed board according to claim 1; and an assembly part including a third terminal and an end surface, the third terminal being conductively joined to the second terminal, the end surface being a leading surface of the assembly part in the first direction, wherein the third terminal has an end-surface edge provided between the second through-hole via and the end surface in the first direction, and wherein, in a state in which the third terminal is conductively joined to the second terminal, the plurality of through-hole vias includes a third through-hole via closest to the end-surface edge of the third terminal in the first direction, the third through-hole via has a third distance between the third through-hole via and the end-surface edge of the third terminal, the third distance being set to be equal to or smaller than one eighth of a signal wavelength of a high speed signal transmitted through the third terminal.

8. The printed board assembly according to claim 7, wherein the signal wavelength of the high speed signal transmitted through the third terminal is determined for the high speed signal having a frequency component at a frequency of 30 GHz or more.

9. The printed board assembly according to claim 7, wherein the assembly part includes a positioning member configure to match a position of the assembly part to a position of the printed board in the first direction.

10. The printed board assembly according to claim 9, wherein the positioning member is configured to be in contact with the end face.

11. The printed board assembly according to claim 10, wherein, in a state in which the positioning member is in contact with the end face, the end-surface edge of the third terminal has a position that coincides with a position of the inner edge of the second terminal in the first direction.

12. The printed board assembly according to claim 7, wherein the assembly part is a package of an optical module, the package housing at least one of a light emitting element or a light reception element.

13. The printed board assembly according to claim 7, wherein the assembly part includes:

a fourth wiring layer including a second signal line placed away from the third terminal in the thickness direction;

a second dielectric layer interposed between a third wiring layer including the third terminal and the fourth wiring layer; and a plurality of through-hole vias configured to electrically connect the third terminal and the second signal line to each other, the plurality of through-hole vias of the assembly part being placed along the first direction inside the third terminal and the second signal line in the planer view, wherein the plurality of through-hole vias of the assembly part includes a fourth through-hole via closest to an end-surface edge of the second signal line in the first direction, and wherein the fourth through-hole via has a fourth distance between the fourth through-hole via and the end-surface edge of the second signal line, the fourth distance being set to be equal to or smaller than one eighth of a signal wavelength of a high speed signal transmitted through the second signal line.

* * * * *